US012796136B2

(12) United States Patent

Uesaka et al.

(10) Patent No.: US 12,796,136 B2
(45) Date of Patent: Nov. 10, 2026

(54) SOLID-STATE IMAGING ELEMENT AND ELECTRONIC DEVICE

(71) Applicant: SONY SEMICONDUCTOR SOLUTIONS CORPORATION, Kanagawa (JP)

(72) Inventors: Yusuke Uesaka, Kanagawa (JP); Kazuyoshi Yamashita, Kanagawa (JP); Yoshiaki Masuda, Kanagawa (JP); Shinichiro Kurihara, Tokyo (JP); Syogo Kurogi, Kumamoto (JP); Toshiki Sakamoto, Kumamoto (JP); Hiroyuki Kawano, Kumamoto (JP); Masatoshi Iwamoto, Kumamoto (JP); Takashi Terada, Kumamoto (JP); Sintaro Nakajiki, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 1005 days.

(21) Appl. No.: 17/996,027

(22) PCT Filed: Apr. 13, 2021

(86) PCT No.: PCT/JP2021/015319

§ 371 (c)(1),
(2) Date: Oct. 12, 2022

(87) PCT Pub. No.: WO2021/215303

PCT Pub. Date: Oct. 28, 2021

(65) Prior Publication Data

US 2023/0197748 A1 Jun. 22, 2023

(30) Foreign Application Priority Data

Apr. 20, 2020 (JP) ................................ 2020-074981

(51) Int. Cl.

*H10F 39/00* (2025.01)
*H04N 23/20* (2023.01)
*H10F 39/18* (2025.01)

(52) U.S. Cl.

CPC ......... *H10F 39/8057* (2025.01); *H04N 23/20* (2023.01); *H10F 39/182* (2025.01);
(Continued)

(58) Field of Classification Search

CPC ............... H10F 39/8057; H10F 39/182; H10F 39/8053; H10F 39/807; H10F 39/811; H10F 39/8063; H04N 23/20
See application file for complete search history.

(56) References Cited

U.S. PATENT DOCUMENTS

2014/0054662 A1 2/2014 Yanagita et al.
2015/0022868 A1 1/2015 Shimizu
(Continued)

FOREIGN PATENT DOCUMENTS

JP 2009-164385 7/2009
JP 2011-135100 7/2011
(Continued)

*Primary Examiner* — Shih Tsun A Chou
(74) *Attorney, Agent, or Firm* — Sheridan Ross P.C.

(57) ABSTRACT

The solid-state imaging element includes a plurality of first light receiving pixels that receives visible light, a plurality of second light receiving pixels that receives infrared light, a separation region, and a light shielding wall. The plurality of first light receiving pixels and the plurality of second light receiving pixels are arranged in a matrix, and the separation region is arranged in a lattice pattern and has a plurality of intersection portions. The light shielding wall is provided in the separation region, and includes a first light shielding wall provided along a first direction in plan view, and a second light shielding wall provided along a second direction intersecting the first direction in plan view. In addition, the first
(Continued)

light shielding wall and the second light shielding wall are spaced apart at the intersection portion of at least a part of the separation region.

8 Claims, 21 Drawing Sheets

(52) U.S. Cl.
CPC ....... *H10F 39/8053* (2025.01); *H10F 39/807* (2025.01); *H10F 39/811* (2025.01)

(56) References Cited

U.S. PATENT DOCUMENTS

| | | | | |
|---|---|---|---|---|
| 2015/0091122 | A1* | 4/2015 | Okazaki | H10F 39/807 257/446 |
| 2015/0221692 | A1 | 8/2015 | Enomoto et al. | |
| 2018/0359434 | A1* | 12/2018 | Tanaka | H10F 39/182 |
| 2019/0206917 | A1 | 7/2019 | Nakajiki et al. | |
| 2019/0244992 | A1 | 8/2019 | Yokogawa et al. | |

FOREIGN PATENT DOCUMENTS

| | | |
|---|---|---|
| JP | 2013-175494 | 9/2013 |
| JP | 2013-243324 | 12/2013 |
| JP | 2014-033107 | 2/2014 |
| JP | 2015-153772 | 8/2015 |
| JP | 2017-108062 | 6/2017 |
| JP | 2017-139286 | 8/2017 |
| JP | 2020-027884 | 2/2020 |
| WO | WO 2018/043654 | 3/2018 |
| WO | WO 2018/079296 | 5/2018 |

* cited by examiner

SOLID-STATE IMAGING ELEMENT AND ELECTRONIC DEVICE

CROSS REFERENCE TO RELATED APPLICATIONS

This application is a national stage application under 35 U.S.C. 371 and claims the benefit of PCT Application No. PCT/JP2021/015319, having an international filing date of 13 Apr. 2021, which designated the United States, which PCT application claimed the benefit of Japanese Patent Application No. 2020-074981, filed 20 Apr. 2020, the entire disclosures of each of which are incorporated herein by reference.

FIELD

The present disclosure relates to a solid-state imaging element and an electronic device.

BACKGROUND

In recent years, a solid-state imaging element capable of simultaneously acquiring a visible light image and an infrared image has been known. In such a solid-state imaging element, a light receiving pixel that receives visible light and a light receiving pixel that receives infrared light are formed side by side in the same pixel array unit (see, for example, Patent Literature 1).

CITATION LIST

Patent Literature

Patent Literature 1: JP 2017-139286 A

SUMMARY

Technical Problem

However, in a case where a visible light receiving pixel and an infrared light receiving pixel are formed in the same pixel array unit, infrared light incident on the infrared light receiving pixel may leak to an adjacent light receiving pixel, and color mixture may occur in the adjacent light receiving pixel.

Therefore, the present disclosure proposes a solid-state imaging element and an electronic device capable of suppressing occurrence of color mixing.

Solution to Problem

According to the present disclosure, there is provided a solid-state imaging element. The solid-state imaging element includes a plurality of first light receiving pixels that receives visible light, a plurality of second light receiving pixels that receives infrared light, a separation region, and a light shielding wall. In the pixel array unit in which the plurality of first light receiving pixels and the plurality of second light receiving pixels are arranged in a matrix, the separation region is arranged in a lattice pattern between the light receiving pixels adjacent to each other, and has a plurality of intersection portions. The light shielding wall is provided in the separation region. In addition, the light shielding wall includes a first light shielding wall provided along a first direction in plan view, and a second light shielding wall provided along a second direction intersecting the first direction in plan view. In addition, the first light shielding wall and the second light shielding wall are spaced apart at the intersection portion of at least a part of the separation region.

DESCRIPTION OF EMBODIMENTS

Figure 1:
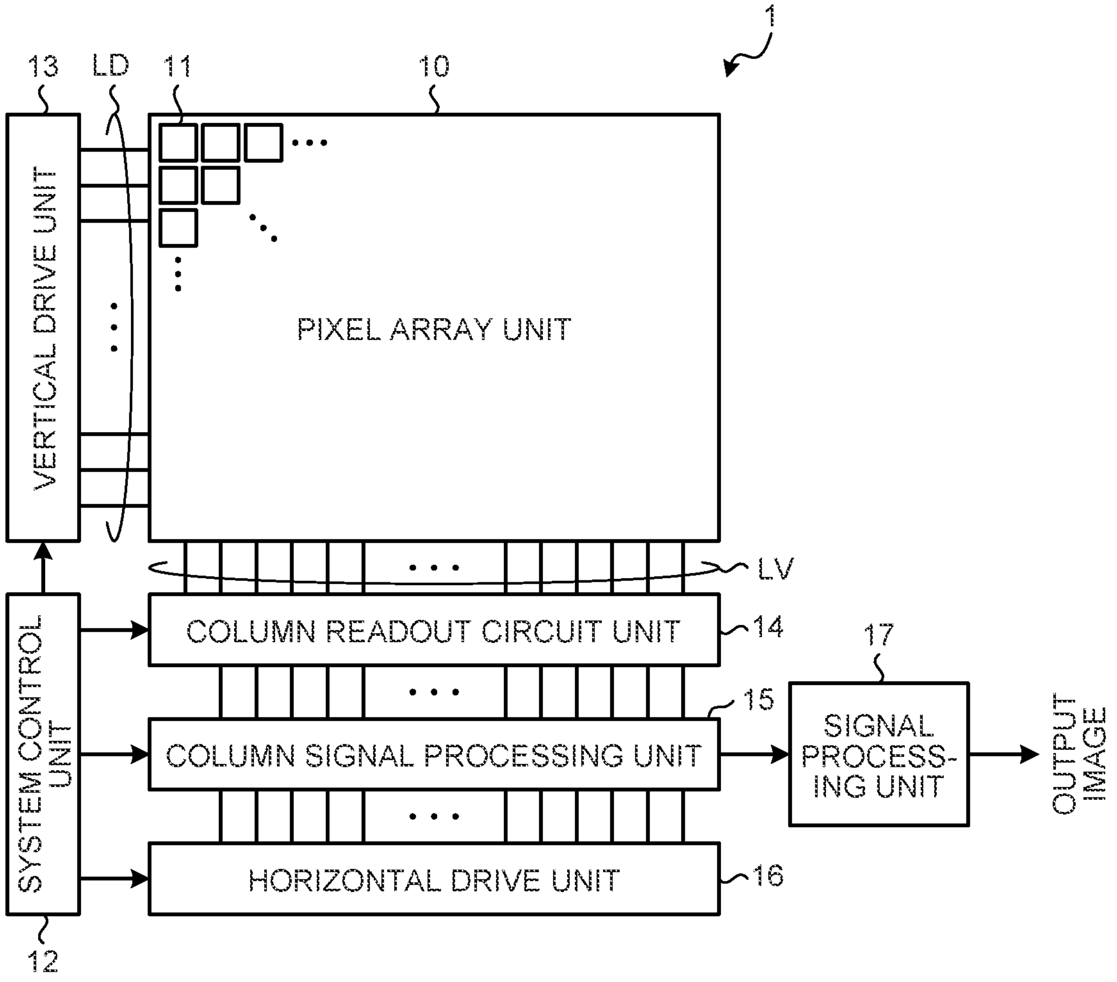
FIG. 1 is a system configuration diagram illustrating a schematic configuration example of a solid-state imaging element according to an embodiment of the present disclosure.

Hereinafter, each embodiments of the present disclosure will be described in detail with reference to the drawings. In each of the following embodiments, the same parts are denoted by the same reference numerals, and redundant description will be omitted.

In recent years, a solid-state imaging element capable of simultaneously acquiring a visible light image and an infrared image has been known. In such a solid-state imaging element, a light receiving pixel that receives visible light and a light receiving pixel that receives infrared light are formed side by side in the same pixel array unit.

However, in a case where a visible light receiving pixel and an infrared light receiving pixel are formed in the same pixel array unit, infrared light incident on the infrared light receiving pixel may leak to an adjacent light receiving pixel, and color mixture may occur in the adjacent light receiving pixel.

This is because infrared light has a longer wavelength than visible light and thus has a longer optical path length, in a manner that infrared light is likely to leak from the gap between the light shielding wall of the separation region and the wiring layer to the adjacent light receiving pixel.

Therefore, realization of a technique capable of overcoming the above-described problems and suppressing occurrence of color mixing is expected.

<Configuration of Solid-State Imaging Element>

FIG. 1 is a system configuration diagram illustrating a schematic configuration example of a solid-state imaging element 1 according to an embodiment of the present disclosure. As illustrated in FIG. 1, a solid-state imaging element 1 that is a CMOS image sensor includes a pixel array unit 10, a system control unit 12, a vertical drive unit 13, a column readout circuit unit 14, a column signal processing unit 15, a horizontal drive unit 16, and a signal processing unit 17.

The pixel array unit 10, the system control unit 12, the vertical drive unit 13, the column readout circuit unit 14, the column signal processing unit 15, the horizontal drive unit 16, and the signal processing unit 17 are provided on the same semiconductor substrate or on a plurality of electrically connected laminated semiconductor substrates.

In the pixel array unit 10, effective unit pixels (hereinafter, also referred to as unit pixels) 11 each having a photoelectric conversion element (such as a photodiode PD (see FIG. 4)) capable of photoelectrically converting a charge amount corresponding to an incident light amount, accumulating the charge amount inside, and outputting the charge amount as a signal are two-dimensionally arranged in a matrix.

In addition, in addition to the effective unit pixel 11, the pixel array unit 10 may include a region in which a dummy unit pixel having a structure without a photodiode PD and the like, a light-shielding unit pixel in which light incidence from the outside is shielded by shielding the light-receiving surface, and the like is arranged in a row and/or column.

Note that the light-shielding unit pixel may have the same configuration as the effective unit pixel 11 except for having a structure in which the light-receiving surface is shielded from light. In addition, in the following description, the photocharge of a charge amount corresponding to the incident light amount is also simply referred to as "charge", and the unit pixel 11 is also simply referred to as "pixel".

In the pixel array unit 10, a pixel drive line LD is formed for each row along the left-right direction in the drawing (the array direction of the pixels in the pixel row) with respect to the pixel array in a matrix, and a vertical pixel wiring LV is formed for each column along the up-down direction in the drawing (the array direction of the pixels in the pixel column). One end of the pixel drive line LD is connected to an output terminal corresponding to each row of the vertical drive unit 13.

The column readout circuit unit 14 includes at least a circuit that supplies a constant current to the unit pixel 11 in a selected row in the pixel array unit 10 for each column, a current mirror circuit, a changeover switch of the unit pixel 11 to be read, and the like.

Then, the column readout circuit unit 14 configures an amplifier together with the transistor in the selected pixel in the pixel array unit 10, converts the photocharge signal into a voltage signal, and outputs the voltage signal to the vertical pixel wiring LV.

The vertical drive unit 13 includes a shift register, an address decoder, and the like, and drives each unit pixel 11 of the pixel array unit 10 at the same time for all pixels or in units of rows. Although a specific configuration of the vertical drive unit 13 is not illustrated, the vertical drive unit 13 has a configuration including a readout scanning system and a sweep scanning system or a batch sweep and batch transfer system.

In order to read a pixel signal from the unit pixel 11, the readout scanning system sequentially selects and scans the unit pixel 11 of the pixel array unit 10 in units of rows. In the case of row driving (rolling shutter operation), sweep scanning is performed on a readout row on which readout scanning is performed by the readout scanning system prior to the readout scanning by a time corresponding to a shutter speed.

In addition, in the case of global exposure (global shutter operation), batch sweeping is performed earlier than batch transfer by the time of the shutter speed. By such sweeping, unnecessary charges are swept (reset) from the photodiode PD and the like of the unit pixel 11 in the readout row. Then, so-called electronic shutter operation is performed by sweeping (resetting) unnecessary charges.

Here, the electronic shutter operation refers to an operation of discarding unnecessary photocharges accumulated in the photodiode PD and the like until immediately before and newly starting exposure (starting accumulation of photocharges).

The signal read by the readout operation by the readout scanning system corresponds to the amount of light incident after the immediately preceding readout operation or electronic shutter operation. In the case of the row drive, a period from the readout timing by the immediately preceding readout operation or the sweep timing by the electronic shutter operation to the readout timing by the current readout operation is the photocharge accumulation time (exposure time) in the unit pixel 11. In the case of global exposure, the time from batch sweeping to batch transfer is the accumulation time (exposure time).

The pixel signal output from each unit pixel 11 of the pixel row selectively scanned by the vertical drive unit 13 is supplied to the column signal processing unit 15 through each of the vertical pixel wirings LV. The column signal processing unit 15 performs predetermined signal processing on the pixel signal output from each unit pixel 11 of the selected row through the vertical pixel wiring LV for each pixel column of the pixel array unit 10, and temporarily holds the pixel signal after the signal processing.

Specifically, the column signal processing unit 15 performs at least noise removal processing, for example, correlated double sampling (CDS) processing as signal processing. By the CDS processing by the column signal processing unit 15, fixed pattern noise unique to pixels such as reset noise and threshold variation of the amplification transistor AMP is removed.

Note that the column signal processing unit 15 can be configured to have, for example, an AD conversion function in addition to the noise removal processing and output the pixel signal as a digital signal.

The horizontal drive unit 16 includes a shift register, an address decoder, and the like, and sequentially selects a unit circuit corresponding to a pixel column of the column signal processing unit 15. By the selective scanning by the horizontal drive unit 16, the pixel signals subjected to the signal processing by the column signal processing unit 15 are sequentially output to the signal processing unit 17.

The system control unit 12 includes a timing generator that generates various timing signals and the like, and performs drive control of the vertical drive unit 13, the column signal processing unit 15, the horizontal drive unit 16, and the like based on various timing signals generated by the timing generator.

The solid-state imaging element 1 further includes a signal processing unit 17 and a data storage unit (not illustrated). The signal processing unit 17 has at least an addition processing function, and performs various types of signal processing such as addition processing on the pixel signal output from the column signal processing unit 15.

The data storage unit temporarily stores data necessary for signal processing in the signal processing unit 17. The signal processing unit 17 and the data storage unit may be processed by an external signal processing unit provided on a substrate different from the solid-state imaging element 1, for example, a digital signal processor (DSP) or software, or may be mounted on the same substrate as the solid-state imaging element 1.

<Configuration of Pixel Array Unit>

Figure 2:
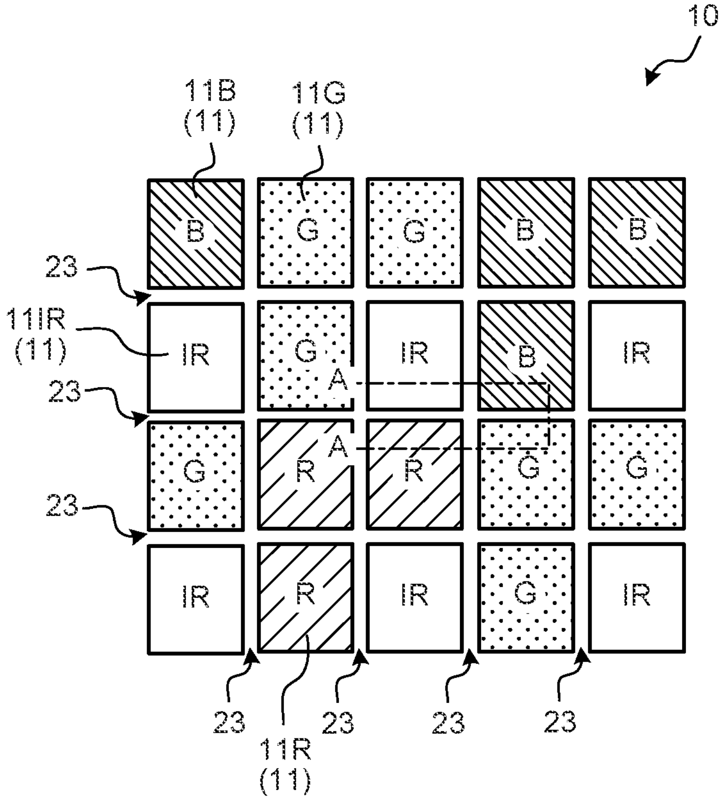
FIG. 2 is a plan view illustrating an example of a pixel array unit according to an embodiment of the present disclosure.

Next, a detailed configuration of the pixel array unit 10 will be described with reference to FIGS. 2 to 6. FIG. 2 is a plan view illustrating an example of the pixel array unit 10 according to an embodiment of the present disclosure.

As illustrated in FIG. 2, in the pixel array unit 10 according to the embodiment, a plurality of unit pixels 11 is arranged side by side in a matrix. The plurality of unit pixels 11 includes an R pixel 11R that receives red light, a G pixel 11G that receives green light, a B pixel 11B that receives blue light, and an IR pixel 11IR that receives infrared light.

The R pixel 11R, the G pixel 11G, and the B pixel 11B are examples of first light receiving pixels, and are also collectively referred to as "visible light pixels" below. In addition, the IR pixel 11IR is an example of a second light receiving pixel.

In addition, a separation region 23 is provided between the adjacent unit pixels 11. The separation regions 23 are arranged in a lattice shape in a plan view in the pixel array unit 10.

In the pixel array unit 10 according to the embodiment, for example, as illustrated in FIG. 2, visible light pixels of the same type may be arranged in an L shape, and IR pixels 11IR may be arranged in the remaining portions.

Figure 3:
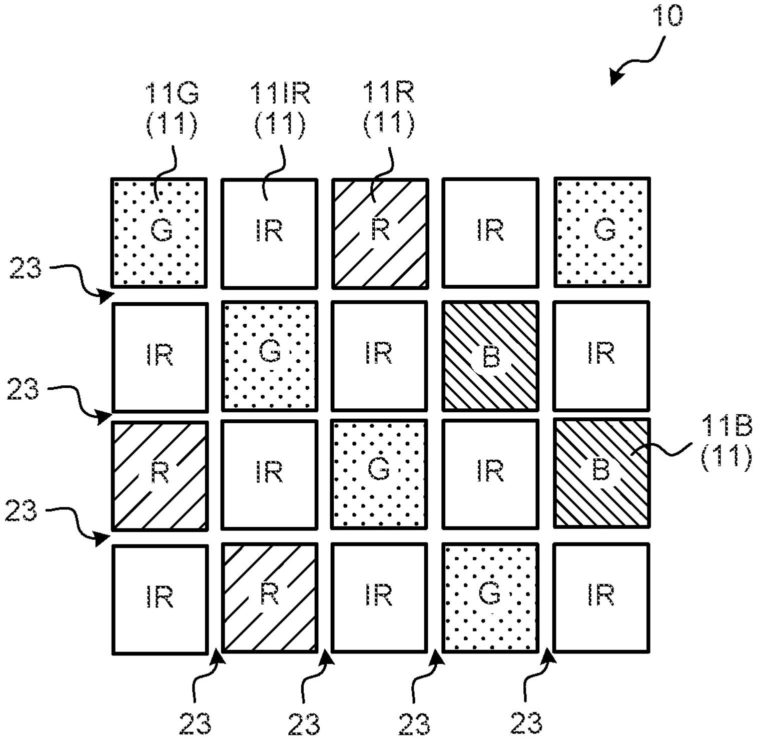
FIG. 3 is a plan view illustrating another example of the pixel array unit according to an embodiment of the present disclosure.

Note that the arrangement of the visible light pixels and the IR pixels 11IR in the pixel array unit 10 is not limited to the example of FIG. 2. For example, as illustrated in FIG. 3, the IR pixels 11IR may be arranged in a checkered pattern, and three types of visible light pixels may be arranged in the remaining portions. FIG. 3 is a plan view illustrating another example of the pixel array unit 10 according to an embodiment of the present disclosure.

Figure 4:
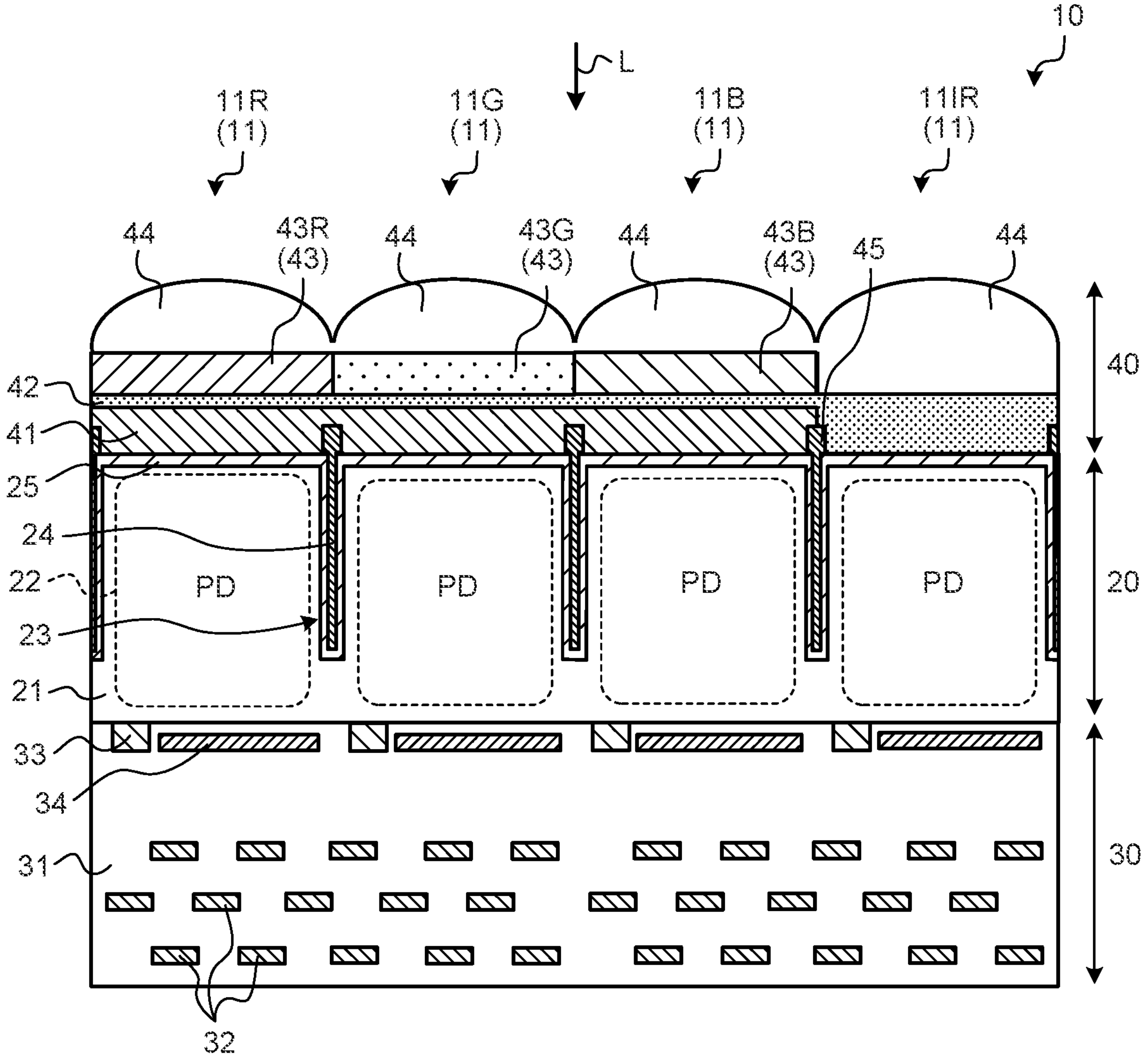
FIG. 4 is a cross-sectional view schematically illustrating a structure of the pixel array unit according to an embodiment of the present disclosure.

FIG. 4 is a cross-sectional view schematically illustrating a structure of the pixel array unit 10 according to an embodiment of the present disclosure, and is a view corresponding to a cross-sectional view taken along line A-A of FIG. 2.

As illustrated in FIG. 4, the pixel array unit 10 according to the embodiment includes a semiconductor layer 20, a wiring layer 30, and an optical layer 40. Then, in the pixel array unit 10, the optical layer 40, the semiconductor layer 20, and the wiring layer 30 are laminated in this order from the side on which light L from the outside is incident (hereinafter, also referred to as a light incident side).

The semiconductor layer 20 includes a semiconductor region 21 of a first conductivity type (for example, P-type) and a semiconductor region 22 of a second conductivity type (for example, N-type). Then, in the semiconductor region 21 of the first conductivity type, the semiconductor region 22 of the second conductivity type is formed in units of pixels, forming the photodiode PD by PN junction. The photodiode PD is an example of a photoelectric conversion unit.

In addition, the above-described separation region 23 is provided in the semiconductor layer 20. The separation region 23 separates the photodiodes PD of the unit pixels 11 adjacent to each other. In addition, in the separation region 23, a light shielding wall 24 and a metal oxide film 25 are provided.

The light shielding wall 24 is a wall-shaped film that is provided along the separation region 23 in plan view and shields light obliquely incident from the adjacent unit pixel 11. By providing such a light shielding wall 24, it is possible to suppress incidence of light transmitted through the adjacent unit pixels 11, and thus, it is possible to suppress occurrence of color mixing.

The light shielding wall 24 is made of a material having a light shielding property, such as various metals (tungsten, aluminum, silver, copper and alloys of these) or a black organic film. In addition, in the embodiment, the light shielding wall 24 does not penetrate the semiconductor layer 20, and extends from the surface on the light incident side of the semiconductor layer 20 to the middle of the semiconductor layer 20. Details of the light shielding wall 24 will be described later.

The metal oxide film 25 is provided to cover the light shielding wall 24 in the separation region 23. In addition, the metal oxide film 25 is provided to cover the surface on the light incident side of the semiconductor region 21. The metal oxide film 25 is made of, for example, a material having a fixed charge (for example, hafnium oxide, tantalum oxide, aluminum oxide, zirconium oxide, and the like).

In the embodiment, an antireflection film, an insulating film, and the like may be separately provided between the metal oxide film 25 and the light shielding wall 24.

The wiring layer 30 is arranged on the surface on the opposite side of the light incident side of the semiconductor layer 20. The wiring layer 30 is configured by forming a plurality of layers of wiring 32 and a plurality of pixel transistors 33 in an interlayer insulating film 31. The plurality of pixel transistors 33 reads out charges accumulated in the photodiode PD, and the like.

In addition, the wiring layer 30 according to the embodiment further includes a metal layer 34 made of a metal containing tungsten as a main component. The metal layer 34 is provided on the light incident side of the plurality of layers of wiring 32 in each unit pixel 11.

The optical layer 40 is arranged on the surface on the light incident side of the semiconductor layer 20. The optical layer 40 includes an IR cut filter 41, a planarizing film 42, a color filter 43, and an on-chip lens (OCL) 44.

The IR cut filter 41 is formed of an organic material to which a near-infrared absorbing dye is added as an organic coloring material. The IR cut filter 41 is arranged on the surface on the light incident side of the semiconductor layer 20 in the visible light pixel (R pixel 11R, G pixel 11G, and B pixel 11B), and is not arranged on the surface on the light incident side of the semiconductor layer 20 in the IR pixel 11IR. Details of the IR cut filter 41 will be described later.

The planarizing film 42 is provided to planarize the surface on which the color filter 43 and the OCL 44 are formed and to avoid unevenness occurring in the rotational coating process when the color filter 43 and the OCL 44 are formed.

The planarizing film 42 is formed of, for example, an organic material (for example, acrylic resin). Note that the planarizing film 42 is not limited to being formed of an organic material, and may be formed of silicon oxide, silicon nitride, and the like.

In addition, as described above, since the IR cut filter 41 is not provided in the IR pixel 11IR, the planarizing film 42 is in direct contact with the metal oxide film 25 of the semiconductor layer 20 in the IR pixel 11IR.

The color filter 43 is an optical filter that transmits light of a predetermined wavelength among the light L collected by the OCL 44. The color filters 43 are arranged on a surface on the light incident side of the planarizing film 42 in the visible light pixel (R pixel 11R, G pixel 11G, and B pixel 11B).

The color filter 43 includes, for example, a color filter 43R that transmits red light, a color filter 43G that transmits green light, and a color filter 43B that transmits blue light.

In the embodiment, the color filter 43R is provided in the R pixel 11R, the color filter 43G is provided in the G pixel 11G, and the color filter 43B is provided in the B pixel 11B. In addition, in the embodiment, the color filter 43 is not arranged in the IR pixel 11IR.

The OCL 44 is a lens that is provided for each unit pixel 11 and collects the light L on the photodiode PD of each unit pixel 11. The OCL 44 is made of, for example, an acrylic resin and the like. In addition, as described above, since the color filter 43 is not provided in the IR pixel 11IR, the OCL 44 is in direct contact with the planarizing film 42 in the IR pixel 11IR.

In addition, in the interface between the IR cut filter 41 or the planarizing film 42 and the semiconductor layer 20, a light shielding wall 45 is provided at a position corresponding to the separation region 23. The light shielding wall 45 is a wall-shaped film that shields light obliquely incident from the adjacent unit pixel 11, and is provided to be connected to the light shielding wall 24.

By providing such a light shielding wall 45, it is possible to suppress incidence of light transmitted through the IR cut filter 41 and the planarizing film 42 of the adjacent unit pixels 11, and thus, it is possible to suppress occurrence of color mixing. The light shielding wall 45 is made of, for example, aluminum, tungsten, and the like.

Figure 5:
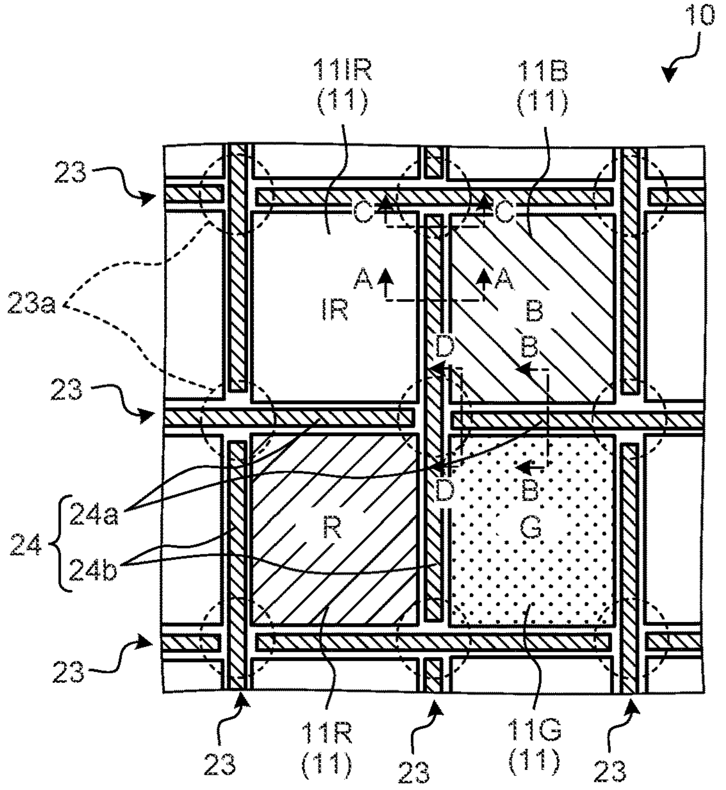
FIG. 5 is a plan view schematically illustrating a structure of the pixel array unit according to an embodiment of the present disclosure.

Here, in the embodiment, the occurrence of color mixing in the pixel array unit 10 can be suppressed by arranging the light shielding wall 24 provided in the separation region 23 as follows. FIG. 5 is a plan view schematically illustrating a structure of the pixel array unit 10 according to an embodiment of the present disclosure.

As illustrated in FIG. 5, in the pixel array unit 10, the separation regions 23 are arranged in a lattice shape between the plurality of unit pixels 11 arranged side by side in a matrix in plan view. A plurality of intersection portions **23*a* is provided in the lattice-shaped separation region 23**.

The intersection portion **23*a* is a portion where a portion extending in the horizontal direction and a portion extending in the vertical direction intersect in the separation region 23**. The horizontal direction is an example of a first direction, and the vertical direction is an example of a second direction.

In addition, a wall-shaped first light shielding wall **24*a* is provided along the horizontal direction at a portion extending in the horizontal direction in the separation region 23, and a wall-shaped second light shielding wall 24*b* is provided along the vertical direction at a portion extending in the vertical direction in the separation region 23**.

Here, in the embodiment, as illustrated in FIG. 5, the first light shielding wall **24*a* and the second light shielding wall 24*b* are spaced apart at all the intersection portions 23*a* of the separation region 23. That is, in the embodiment, the light shielding walls 24 do not intersect at all the intersection portions 23*a* of the separation region 23**.

If the light shielding walls 24 intersect at the intersection portions **23*a* of the separation region 23, the light shielding walls 24 are formed deeper in such intersecting portions than in non-intersecting portions. This is because, when a trench for embedding the light shielding wall 24 is formed in the semiconductor layer 20 (see FIG. 4**), the width of the intersecting portion is wider than the width of the non-intersecting portion, in a manner that the trench is formed deeper.

Then, since the tip portion of the light shielding wall 24 and the wiring layer 30 (see FIG. 4) need to be separated by a distance necessary for design, the intersecting portion of the light shielding wall 24, which is the deepest portion, and the wiring layer 30 are designed to be separated by a necessary distance.

As a result, since the distance between the non-intersecting portion that occupies most of the light shielding wall 24 and the wiring layer 30 becomes large, the light L incident on the photodiode PD of the IR pixel 11IR leaks from the largely vacant portion to the adjacent unit pixel 11.

In particular, since infrared light has a longer wavelength than visible light and thus has a longer optical path length, a phenomenon that infrared light leaks into the adjacent unit pixel 11 as described above is remarkably observed.

However, in the embodiment, the light shielding walls 24 do not intersect at the intersection portion 23*a* of the separation region 23. As a result, the light shielding wall 24 can be formed to be deeper as a whole and to approach the wiring layer 30.

Therefore, according to the embodiment, since it is possible to suppress the light L incident on the IR pixel 11IR from leaking into the adjacent unit pixel 11, it is possible to suppress the occurrence of color mixing in the pixel array unit 10 in which the visible light pixel and the IR pixel 11IR are arranged side by side.

In addition, in the embodiment, the first light shielding wall 24*a* and the second light shielding wall 24*b* may be spaced apart at all the intersection portions 23*a* of the separation region 23. As a result, the light shielding wall 24 can be arranged to be further deeper as a whole and to approach the wiring layer 30.

Therefore, according to the embodiment, since it is possible to further suppress the light L incident on the IR pixel 11IR from leaking into the adjacent unit pixel 11, it is possible to further suppress the occurrence of color mixing.

In addition, in the embodiment, as illustrated in FIG. 5, the first light shielding wall 24*a* and the second light shielding wall 24*b* are preferably arranged in a windmill shape in plan view. Here, "windmill-shaped in plan view" means that the first light shielding wall 24*a* and the second light shielding wall 24*b* in contact with four sides of one unit pixel 11 in plan view protrude only on one side from one side of the unit pixel 11, and further have rotational symmetry of 90° with respect to the center of the unit pixel 11.

As a result, since the light shielding wall 24 can be provided along one direction also at the intersection portion 23*a* of the separation region 23, it is possible to further suppress the light L incident on the IR pixel 11IR from leaking into the adjacent unit pixel 11 via the intersection portion 23*a*.

Therefore, according to the embodiment, it is possible to further suppress the occurrence of color mixing in the pixel array unit 10 in which the visible light pixel and the IR pixel 11IR are arranged side by side.

Figure 6:
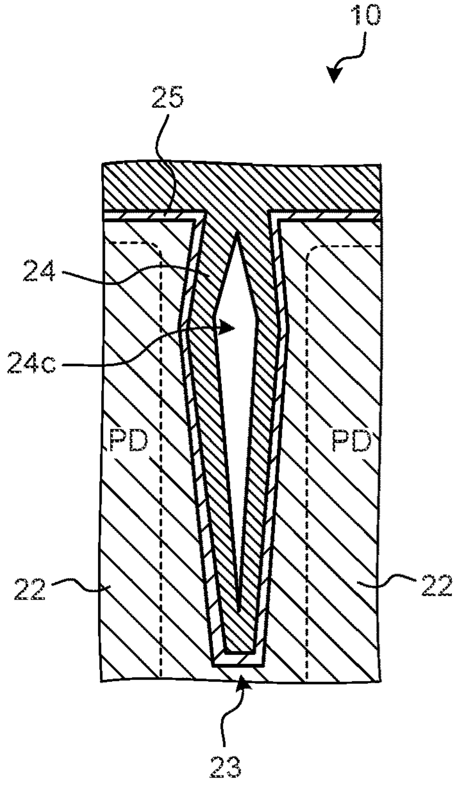
FIG. 6 is a cross-sectional view taken along line A-A and line B-B illustrated in FIG. 5 as viewed in a direction of arrows.

FIG. 6 is a cross-sectional view taken along line A-A and line B-B illustrated in FIG. 5 as viewed in a direction of arrows. FIG. 6 is a cross-sectional view schematically illustrating a structure of the separation region 23 in a portion corresponding to the middle of one side of the unit pixel 11 along which the light shielding wall 24 is along in plan view (hereinafter, also simply referred to as an "intermediate portion of the light shielding wall 24").

As illustrated in FIG. 6, in the separation region 23 according to the embodiment, an aperture 24*c* may be provided inside the light shielding wall 24. The aperture 24*c* can be formed by appropriately adjusting the process condition of embedding when embedding the trench formed in the separation region 23 with the light shielding wall 24.

As a result, since the light L can be reflected at the interface by using the refractive index greatly different at the interface between the light shielding wall 24 and the aperture 24*c*, the light L incident on the photodiode PD can be efficiently reflected by the light shielding wall 24.

Therefore, according to the embodiment, since the light L incident on the photodiode PD can be confined in the photodiode PD on which the light L was incident to increase the optical path length, the sensitivity of the unit pixel 11 can be improved.

Figure 7:
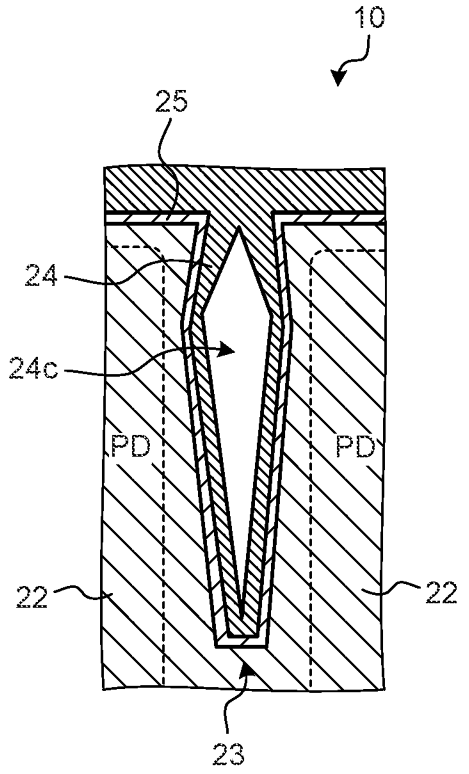
FIG. 7 is a cross-sectional view taken along line C-C and line D-D illustrated in FIG. 5 as viewed in a direction of arrows.

FIG. 7 is a cross-sectional view taken along line C-C and line D-D illustrated in FIG. 5 as viewed in a direction of arrows, and is a cross-sectional view schematically illustrating a structure of the separation region 23 at an end portion of the light shielding wall 24 extending in one direction in a plan view (hereinafter, also simply referred to as "end portion of the light shielding wall 24").

As illustrated in FIG. 7, at the end portion of the light shielding wall 24, the light shielding wall 24 is thinner than the intermediate portion of the light shielding wall 24 illustrated in FIG. 6, and at the end portion of the light shielding wall 24, the light shielding wall 24 is shallower than the intermediate portion of the light shielding wall 24.

As described above, by forming the light shielding wall 24 thin at the end portion of the light shielding wall 24, the internal stress at the end portion of the light shielding wall 24 can be reduced. As a result, at the end portion of the light shielding wall 24, it is possible to suppress generation of a crack in the semiconductor layer 20 or peeling of the light shielding wall 24. Therefore, according to the embodiment, the reliability of the pixel array unit 10 can be improved.

In addition, in the embodiment, by forming the light shielding wall 24 thick at the intermediate portion of the light shielding wall 24, it is possible to improve the light shielding property of the light L at the intermediate portion that occupies most of the light shielding wall 24. As a result, the light L incident on the unit pixel 11 can be confined in the photodiode PD of the incident unit pixel 11 to increase the optical path length, in a manner that the sensitivity of the unit pixel 11 can be improved.

That is, in the embodiment, by making the film thickness of the end portion of the light shielding wall 24 thinner than the film thickness of the intermediate portion, it is possible to achieve both improvement in reliability of the pixel array unit 10 and improvement in sensitivity of the unit pixel 11.

When the magnitude of the film thickness relationship is defined in the present disclosure, the effect of the defined film thickness relationship can be obtained as long as the defined film thickness relationship is satisfied even partially in the cross-sectional view.

Here, the definition of the pixel according to the present disclosure will be described. In the case of a pixel array unit in which pixels having a square shape in plan view are arranged in a matrix, there are a pixel array unit in which an on-chip lens is provided for each pixel, a pixel array unit in which one on-chip lens is provided for two adjacent pixels, a pixel array unit in which one on-chip lens is provided for four pixels adjacent in the matrix direction, and a pixel array unit in which one color filter is provided for four pixels adjacent in the matrix direction. For these pixel array units, one pixel is defined as one pixel, and a length of one side of one pixel in plan view is defined as a cell size.

In addition, for example, in a case where a pixel having a square shape in plan view is separated into two divided pixels having the same area and a rectangular shape in plan view, a pixel having a square shape in plan view in which the two divided pixels are combined is defined as one pixel, and a length of one side of one pixel in plan view is defined as a cell size.

In addition, depending on the solid-state imaging element 1, for example, there is a pixel array unit in which two types of pixels having different sizes are alternately two-dimensionally arranged. In this case, for each of the large pixel and the small pixel, a pixel having the shortest distance between opposing sides is defined as a fine pixel.

Figure 8:
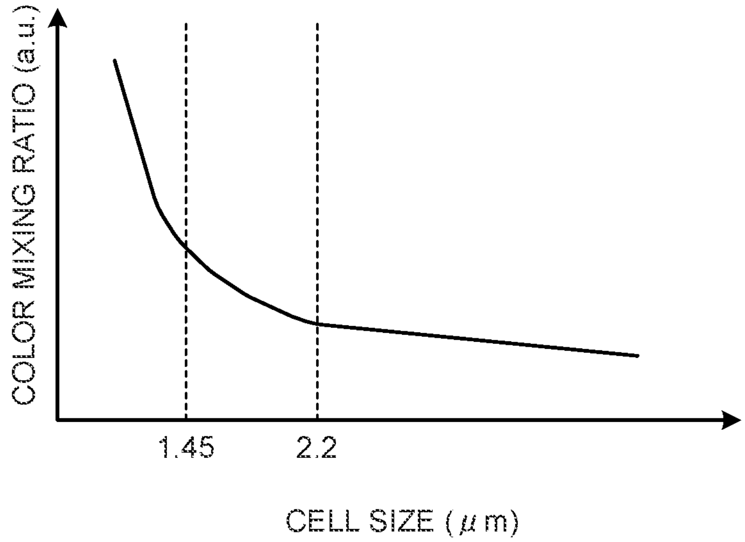
FIG. 8 is a view illustrating a relationship between a cell size and a color mixing ratio in a pixel array unit of a reference example.

Here, in the pixel array unit 10 according to the embodiment, the cell size is preferably 2.2 (μm) or less, and more preferably 1.45 (μm) or less. FIG. 8 is a view illustrating a relationship between a cell size and a color mixing ratio in a pixel array unit of a reference example.

As illustrated in FIG. 8, in the pixel array unit of the reference example, the color mixing ratio rapidly increases when the cell size becomes 2.2 (μm) or less. That is, in the pixel array unit of the reference example, when the cell size is miniaturized in a range of 2.2 (μm) or less, color mixing rapidly increases, and thus, it is very difficult to miniaturize the pixel array unit.

However, in the pixel array unit 10 according to the embodiment, since the occurrence of color mixing can be suppressed as described above, it is possible to acquire an image that does not raise a problem in practical use even if the cell size is miniaturized to 2.2 (μm) or less.

In addition, as illustrated in FIG. 8, in the pixel array unit of the reference example, the color mixing ratio further rapidly increases when the cell size becomes 1.45 (μm) or less. That is, in the pixel array unit of the reference example, when the cell size is miniaturized in a range of 1.45 (μm) or less, color mixing further rapidly increases, and thus, it is more difficult to miniaturize the pixel array unit.

However, in the pixel array unit 10 according to the embodiment, since the occurrence of color mixing can be suppressed as described above, it is possible to acquire an image that does not raise a problem in practical use even if the cell size is miniaturized to 1.45 (μm) or less.

<First Modification>

Figure 9:
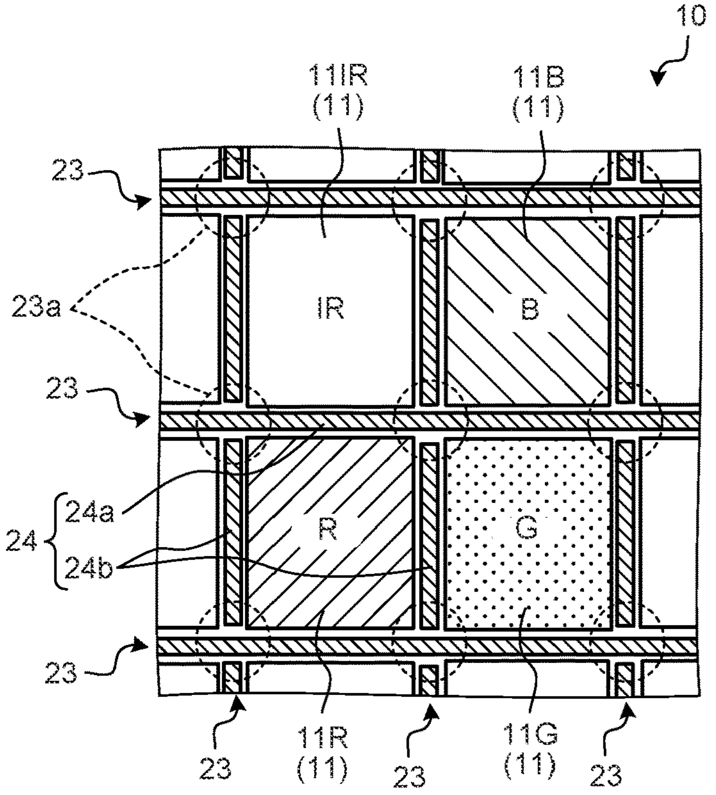
FIG. 9 is a plan view schematically illustrating a structure of a pixel array unit according to a first modification of the embodiment of the present disclosure.

Next, various modifications of the pixel array unit 10 according to the embodiment will be described. FIG. 9 is a plan view schematically illustrating a structure of a pixel array unit 10 according to a first modification of the embodiment of the present disclosure, and is different from the embodiment in arrangement of the first light shielding wall 24*a* and the second light shielding wall 24*b*.

As illustrated in FIG. 9, in the pixel array unit 10 of the first modification, the first light shielding wall 24*a* provided along the horizontal direction in plan view is connected from one end to the other end of the pixel array unit 10.

Then, the second light shielding wall 24*b* provided along the vertical direction is spaced apart from the first light shielding wall 24*a* at the intersection portion 23*a* of the separation region 23. As a result, since the light shielding wall 24 can be provided along one direction also at the intersection portion 23*a* of the separation region 23, it is possible to further suppress the light L incident on the IR pixel 11IR from leaking into the adjacent unit pixel 11 via the intersection portion 23*a*.

Therefore, according to the first modification, it is possible to further suppress the occurrence of color mixing in the pixel array unit 10 in which the visible light pixel and the IR pixel 11IR are arranged side by side.

In addition, in the first modification, since the light shielding wall 24 can be prevented from intersecting at all the intersection portions 23*a* of the separation region 23, the light shielding wall 24 can be arranged to be deeper as a whole to approach the wiring layer 30.

Therefore, according to the first modification, since it is possible to further suppress the light L incident on the IR pixel 11IR from leaking into the adjacent unit pixel 11, it is possible to further suppress the occurrence of color mixing.

<Second Modification>

In the example of FIG. 9, among the light shielding walls 24, an example in which the first light shielding wall 24*a* provided along the horizontal direction is formed to be connected from one end to the other end of the pixel array unit 10 has been described, but the arrangement of the light shielding walls 24 in the present disclosure is not limited to such an example.

Figure 10:
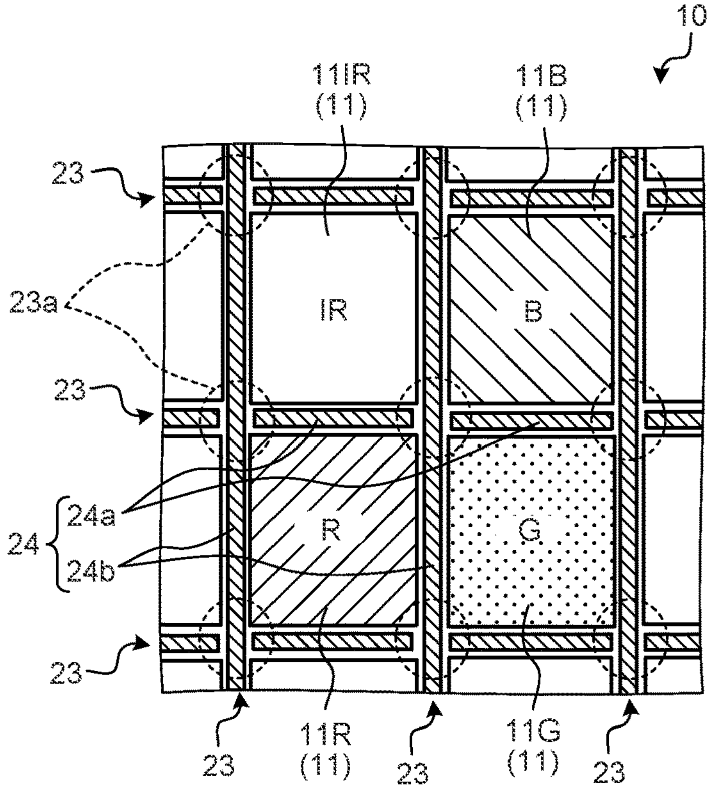
FIG. 10 is a plan view schematically illustrating a structure of a pixel array unit according to a second modification of the embodiment of the present disclosure.

FIG. 10 is a plan view schematically illustrating a structure of a pixel array unit 10 according to a second modification of the embodiment of the present disclosure. As illustrated in FIG. 10, in the pixel array unit 10 of the second modification, the second light shielding wall 24*b* provided along the vertical direction in plan view is connected from one end to the other end of the pixel array unit 10.

Then, the first light shielding wall 24*a* provided along the horizontal direction is spaced apart from the second light shielding wall 24*b* at the intersection portion 23*a* of the separation region 23. As a result, since the light shielding wall 24 can be provided along one direction also at the intersection portion 23*a* of the separation region 23, it is possible to further suppress the light L incident on the IR pixel 11IR from leaking into the adjacent unit pixel 11.

Therefore, according to the second modification, it is possible to further suppress the occurrence of color mixing in the pixel array unit 10 in which the visible light pixel and the IR pixel 11IR are arranged side by side.

In addition, in the second modification, since the light shielding wall 24 can be prevented from intersecting at all the intersection portions 23*a* of the separation region 23, the light shielding wall 24 can be arranged to be deeper as a whole to approach the wiring layer 30.

Therefore, according to the second modification, since it is possible to further suppress the light L incident on the IR pixel 11IR from leaking into the adjacent unit pixel 11, it is possible to further suppress the occurrence of color mixing.

<Third Modification>

Figure 11:
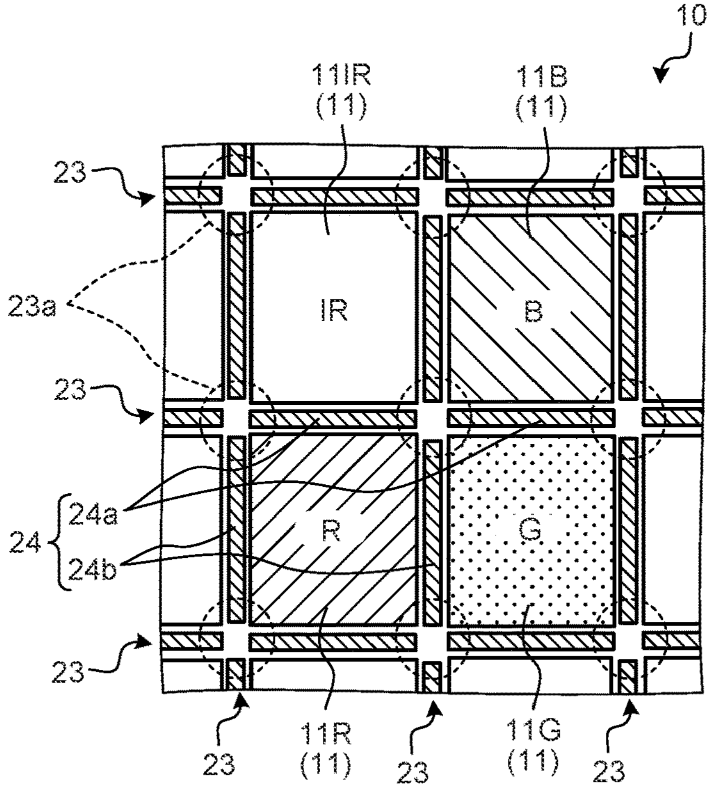
FIG. 11 is a plan view schematically illustrating a structure of a pixel array unit according to a third modification of the embodiment of the present disclosure.

FIG. 11 is a plan view schematically illustrating a structure of a pixel array unit 10 according to a third modification of the embodiment of the present disclosure. As illustrated in FIG. 11, in the pixel array unit 10 of third modification, the first light shielding wall 24*a* provided along the horizontal direction and the second light shielding wall 24*b* provided along the vertical direction are both arranged to be interrupted at the intersection portion 23*a* of the separation region 23 in plan view.

Also by this, since the light shielding wall 24 can be prevented from intersecting at all the intersection portions 23*a* of the separation region 23, the light shielding wall 24 can be arranged to be deeper as a whole to approach the wiring layer 30.

Therefore, according to the third modification, since it is possible to further suppress the light L incident on the IR pixel 11IR from leaking into the adjacent unit pixel 11, it is possible to further suppress the occurrence of color mixing.

<Fourth Modification>

Figure 12:
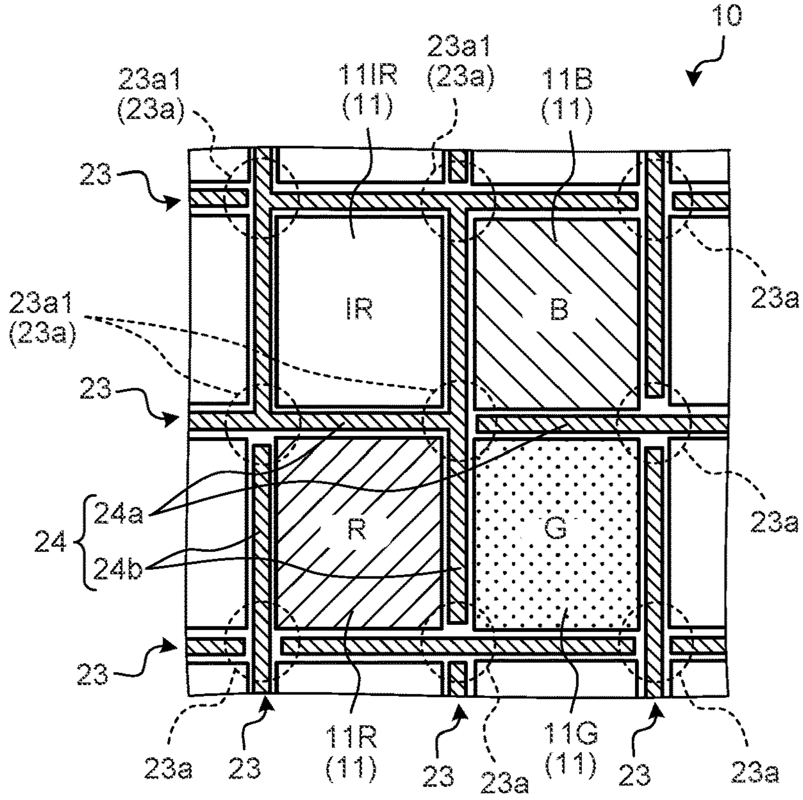
FIG. 12 is a plan view schematically illustrating a structure of a pixel array unit according to a fourth modification of the embodiment of the present disclosure.

In the embodiment and the various modifications described above, an example in which the light shielding walls 24 are provided not to intersect at all the intersection portions 23*a* of the separation region 23 has been described, but the arrangement of the light shielding walls 24 in the present disclosure is not limited to such an example. FIG. 12 is a plan view schematically illustrating a structure of a pixel array unit 10 according to a fourth modification of the embodiment of the present disclosure.

As illustrated in FIG. 12, in the pixel array unit 10 of the fourth modification, the first light shielding wall 24*a* and the second light shielding wall 24*b* may be configured to be connected at some intersection portions 23*a* and not connected at the remaining intersection portions 23*a* in plan view.

Also by this, the light shielding wall 24 can be arranged to be deeper as a whole and to approach the wiring layer 30 as compared with the case where the first light shielding wall 24*a* and the second light shielding wall 24*b* are connected at all the intersection portions 23*a*.

Therefore, according to the fourth modification, since it is possible to suppress the light L incident on the IR pixel 11IR from leaking into the adjacent unit pixel 11, it is possible to suppress the occurrence of color mixing in the pixel array unit 10 in which the visible light pixel and the IR pixel 11IR are arranged side by side.

In addition, in fourth modification, the light shielding wall 24 may be provided to surround the IR pixel 11IR without a gap in plan view. That is, in the fourth modification, the first light shielding wall 24*a* and the second light shielding wall 24*b* are preferably connected at an intersection portion 23*a*1 in contact with the IR pixel 11IR in plan view.

As a result, the light L incident on the IR pixel 11IR can be suppressed from leaking into the adjacent unit pixel 11 via the intersection portion 23*a*1. Therefore, according to the fourth modification, the occurrence of color mixing can further be suppressed.

<Fifth Modification>

Figure 13:
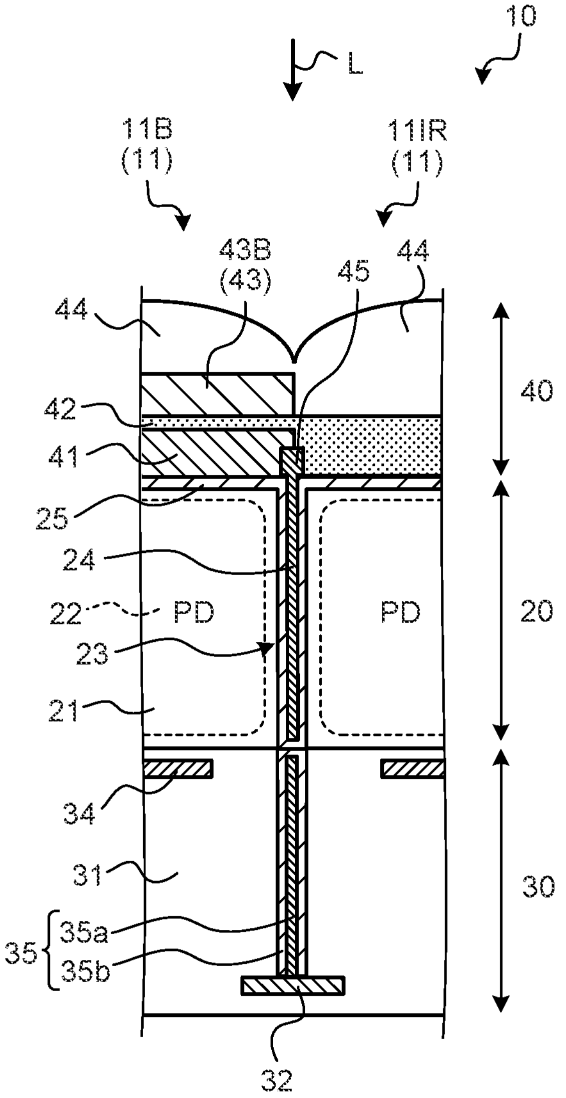
FIG. 13 is a cross-sectional view schematically illustrating a structure of a pixel array unit according to a fifth modification of the embodiment of the present disclosure.

FIG. 13 is a cross-sectional view schematically illustrating a structure of a pixel array unit 10 according to a fifth modification of the embodiment of the present disclosure. As illustrated in FIG. 13, in the pixel array unit 10 of the fifth modification, the light shielding wall 24 of the separation region 23 is provided to penetrate the semiconductor layer 20.

Furthermore, in the fifth modification, a light shielding portion 35 penetrating from the tip portion of the light shielding wall 24 to the wiring 32 of the wiring layer 30 in the light incident direction is provided. The light shielding portion 35 includes a light shielding wall 35*a* and a metal oxide film 35*b*.

The light shielding wall 35*a* is a wall-shaped film that is provided along the separation region 23 in plan view and shields light incident from the adjacent unit pixel 11. The metal oxide film 35*b* is provided to cover the light shielding wall 35*a* in the light shielding portion 35. The light shielding wall 35*a* is made of the same material as the light shielding wall 24, and the metal oxide film 35*b* is made of the same material as the metal oxide film 25.

As illustrated in FIG. 13, by providing the light shielding portion 35 to be connected to the tip portion of the light shielding wall 24, it is possible to suppress the stray light from leaking from the IR pixel 11IR to the adjacent unit pixel 11 via the wiring layer 30. Therefore, according to the fifth modification, the occurrence of color mixing can be suppressed.

<Sixth Modification>

Figure 14:
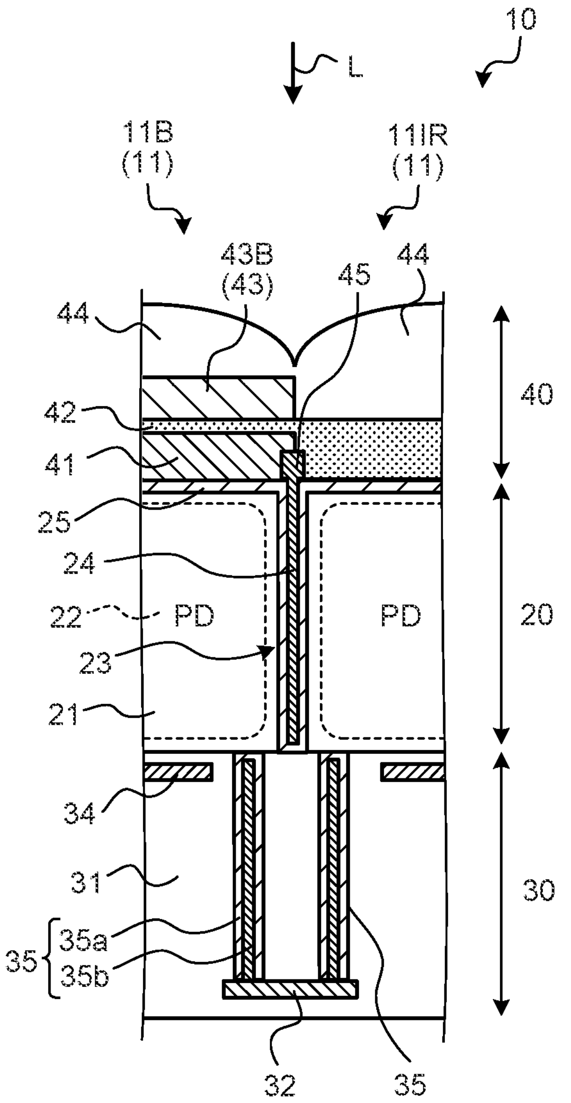
FIG. 14 is a cross-sectional view schematically illustrating a structure of a pixel array unit according to a sixth modification of the embodiment of the present disclosure.

FIG. 14 is a cross-sectional view schematically illustrating a structure of a pixel array unit 10 according to a sixth modification of the embodiment of the present disclosure. As illustrated in FIG. 14, in the pixel array unit 10 of the sixth modification, the light shielding wall 24 of the separation region 23 is provided to penetrate the semiconductor layer 20.

Furthermore, in the sixth modification, a pair of light shielding portions 35 penetrating from the position adjacent to the tip portion of the light shielding wall 24 to the wiring 32 of the wiring layer 30 in the light incident direction is provided. That is, the pixel array unit 10 according to the sixth modification is configured in a manner that the tip portion of the light shielding wall 24 is surrounded by the pair of light shielding portions 35.

Also by this, it is possible suppress the stray light from leaking from the IR pixel 11IR to the adjacent unit pixel 11 via the wiring layer 30. Therefore, according to the sixth modification, the occurrence of color mixing can be suppressed. Note that, in the example of FIG. 14, the light shielding wall 24 may not necessarily be formed to penetrate the semiconductor layer 20.

<Seventh Modification>

Figure 15:
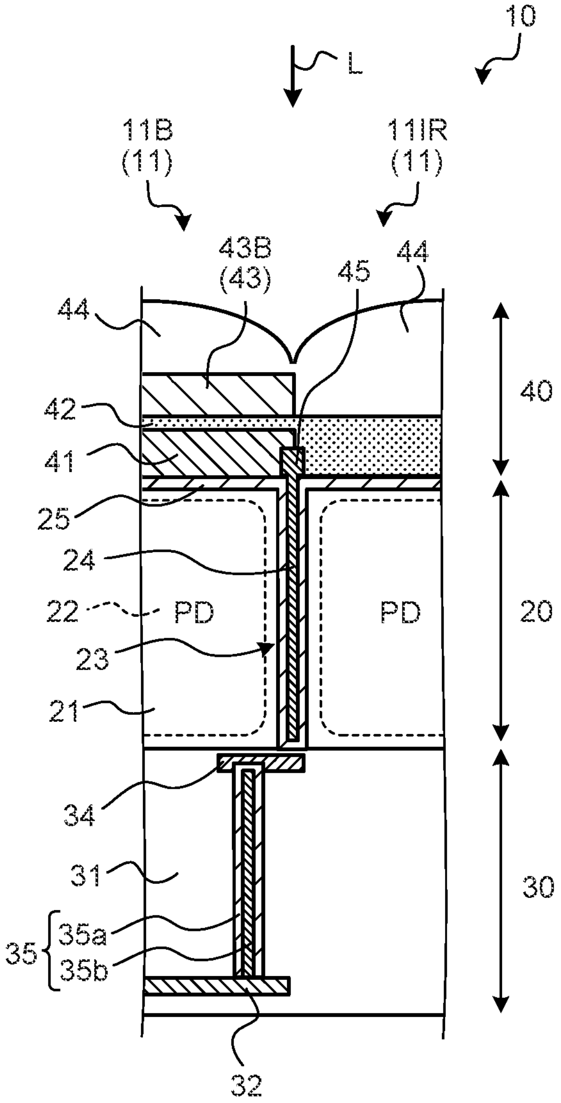
FIG. 15 is a cross-sectional view schematically illustrating a structure of a pixel array unit according to a seventh modification of the embodiment of the present disclosure.

FIG. 15 is a cross-sectional view schematically illustrating a structure of a pixel array unit 10 according to a seventh modification of the embodiment of the present disclosure. As illustrated in FIG. 15, in the pixel array unit 10 of the seventh modification, the light shielding wall 24 of the separation region 23 is provided to penetrate the semiconductor layer 20 and reach the metal layer 34 of the wiring layer 30.

Furthermore, in the seventh modification, a pair of light shielding portions 35 penetrating from a position different from the light shielding wall 24 in the metal layer 34 to the wiring 32 of the wiring layer 30 in the light incident direction is provided. That is, in the seventh modification, the light shielding wall 24, the metal layer 34, and the light shielding portion 35 are configured as a portion having an integrated light shielding function.

Also by this, it is possible suppress the stray light from leaking from the IR pixel 11IR to the adjacent unit pixel 11 via the wiring layer 30. Therefore, according to the seventh modification, the occurrence of color mixing can be suppressed.

<Details of IR Cut Filter>

Figure 16:
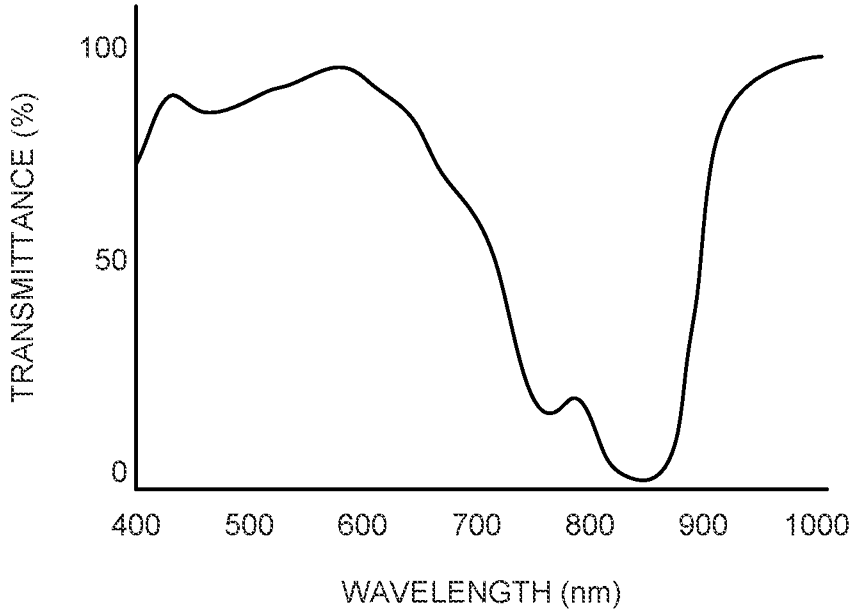
FIG. 16 is a view illustrating an example of a spectral characteristic of an IR cut filter according to an embodiment of the present disclosure.

Next, details of the IR cut filter 41 provided in the visible light pixel will be described with reference to FIGS. 16 to 22 and FIG. 4 described above. FIG. 16 is a view illustrating an example of a spectral characteristic of an IR cut filter 41 according to an embodiment of the present disclosure.

As illustrated in FIG. 16, the IR cut filter 41 has a spectral characteristic in which transmittance is 30(%) or less in a wavelength region of 700 (nm) or more, and particularly has an absorption maximum wavelength in a wavelength region near 850 (nm).

Then, as illustrated in FIG. 4, in the pixel array unit 10 according to the embodiment, the IR cut filter 41 is arranged on the surface on the light incident side of the semiconductor layer 20 in the visible light pixel, and is not arranged on the surface on the light incident side of the semiconductor layer 20 in the IR pixel 11IR.

In addition, in the pixel array unit 10 according to the embodiment, the color filter 43R that transmits red light is arranged in the R pixel 11R, and the color filter 43G that transmits green light is arranged in the G pixel 11G. Furthermore, in the pixel array unit 10 according to the embodiment, a color filter 43B that transmits blue light is arranged in the B pixel 11B.

Figure 17:
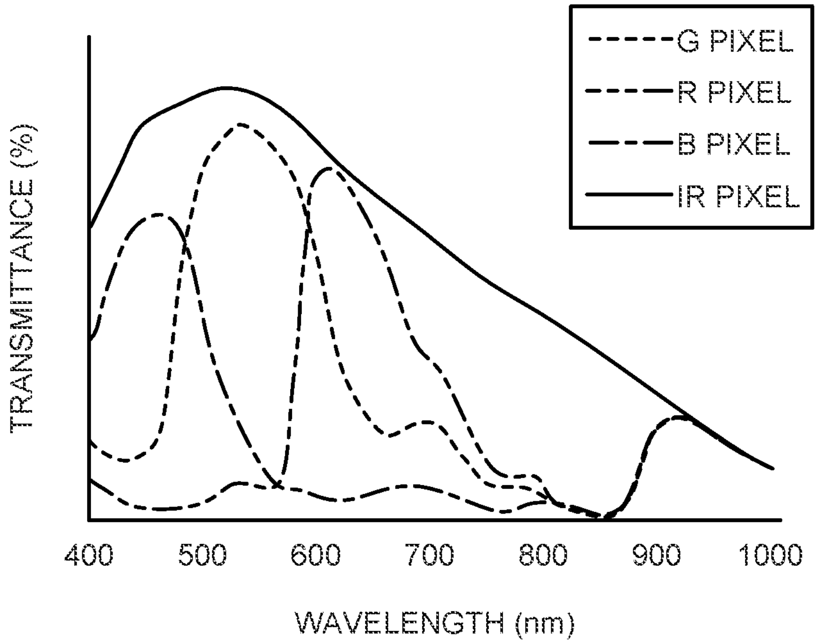
FIG. 17 is a view illustrating an example of spectral characteristics of each unit pixel according to an embodiment of the present disclosure.

With these filters, the spectral characteristic of the light incident on the photodiode PD of the R pixel 11R, the G pixel 11G, the B pixel 11B, and the IR pixel 11IR are as illustrated in a graph in FIG. 17. FIG. 17 is a view illustrating an example of a spectral characteristic of each unit pixel according to an embodiment of the present disclosure.

As illustrated in FIG. 17, in the pixel array unit 10 according to the embodiment, the spectral characteristic of the R pixel 11R, the G pixel 11G, and the B pixel 11B have low transmittance in the infrared light region of wavelengths of about 750 (nm) to 850 (nm).

That is, in the embodiment, by providing the IR cut filter 41 in the visible light pixel, since the influence of the infrared light incident on the visible light pixel can be reduced, the noise of the signal output from the photodiode PD of the visible light pixel can be reduced.

Furthermore, in the pixel array unit 10 according to the embodiment, since the IR cut filter 41 is not provided in the IR pixel 11IR, as illustrated in FIG. 17, the spectral characteristic of the IR pixel 11IR maintain high transmittance in the infrared light region.

That is, in the embodiment, since more infrared light can be incident on the IR pixel 11IR, the intensity of the signal output from the IR pixel 11IR can be increased.

As described above, in the pixel array unit 10 according to the embodiment, the quality of the signal output from the pixel array unit 10 can be improved by providing the IR cut filter 41 only in the visible light pixel.

In addition, in the embodiment, as illustrated in FIG. 4, since the IR cut filter 41 is not provided in the IR pixel 11IR, the planarizing film 42 is in direct contact with the metal oxide film 25 of the semiconductor layer 20 in the IR pixel 11IR.

As described above, by bringing the planarizing film 42 having a refractive index close to that of the metal oxide film 25 into direct contact with the metal oxide film 25, reflection and diffraction on the surface of the metal oxide film 25 can be suppressed.

Therefore, according to the embodiment, since the amount of light L that passes through the surface of the metal oxide film 25 and becomes incident on the photodiode PD of the IR pixel 11IR can be increased, the intensity of the signal output from the IR pixel 11IR can be further increased.

The IR cut filter 41 is formed of an organic material to which a near-infrared absorbing dye is added as an organic coloring material. Examples of the near-infrared absorbing dye include a pyrrolopyrrole dye, a copper compound, a cyanine dye, a phthalocyanine compound, an imonium compound, a thiol complex compound, and a transition metal oxide compound.

In addition, as the near-infrared absorbing dye used for the IR cut filter 41, for example, a squarylium dye, a naphthalocyanine dye, a quaterylene dye, a dithiol metal complex dye, a croconium compound, and the like are also used.

Figure 18:
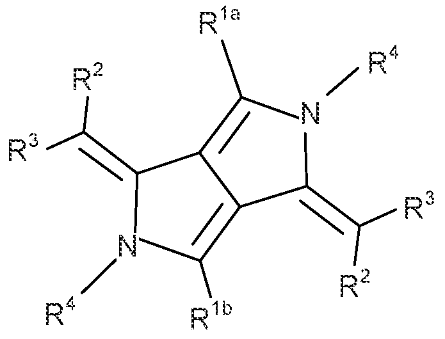
FIG. 18 is a view illustrating an example of a coloring material of the IR cut filter according to an embodiment of the present disclosure.

For the IR pixel 11IR according to the embodiment, the coloring material of the IR cut filter 41 is preferably a pyrrolopyrrole dye represented by the chemical formula of FIG. 18. FIG. 18 is a view illustrating an example of a coloring material of the IR cut filter 41 according to an embodiment of the present disclosure.

In FIG. 18, $R^{1a}$ and $R^{1b}$ each independently represent an alkyl group, an aryl group, or a heteroaryl group. $R^2$ and $R^3$ each independently represent a hydrogen atom or a substituent, and at least one of $R^2$ and $R^3$ is an electron-attracting group. $R^2$ and $R^3$ may be bonded to each other to form a ring.

$R^4$ represents a hydrogen atom, an alkyl group, an aryl group, a heteroaryl group, substituted boron, or a metal atom, and may be covalently bonded or coordinate-bonded to at least one of $R^{1a}$, $R^{1b}$, and $R^3$.

In the example of FIG. 16 described above, the spectral characteristic of the IR cut filter 41 has the absorption maximum wavelength in the wavelength region in the vicinity of 850 (nm), but the transmittance may be 30(%) or less in the wavelength region of 700 (nm) or more.

Figure 19:
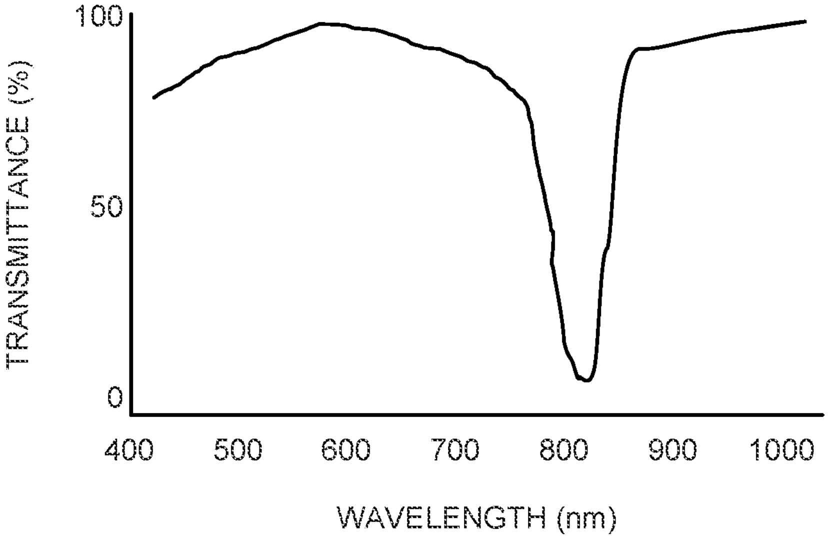
FIG. 19 is a view illustrating another example of spectral characteristics of the IR cut filter according to an embodiment of the present disclosure.

FIGS. 19 to 22 are views illustrating another example of a spectral characteristic of the IR cut filter 41 according to an embodiment of the present disclosure. For example, as illustrated in FIG. 19, the spectral characteristic of the IR cut filter 41 may have a transmittance of 20(%) in a wavelength region of 800 (nm) or more.

Figure 20:
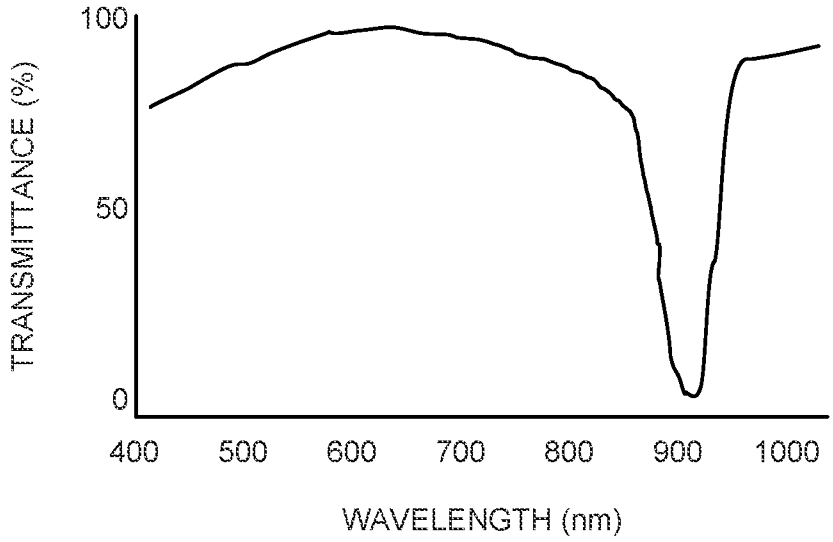
FIG. 20 is a view illustrating another example of a spectral characteristic of the IR cut filter according to an embodiment of the present disclosure.
Figure 21:
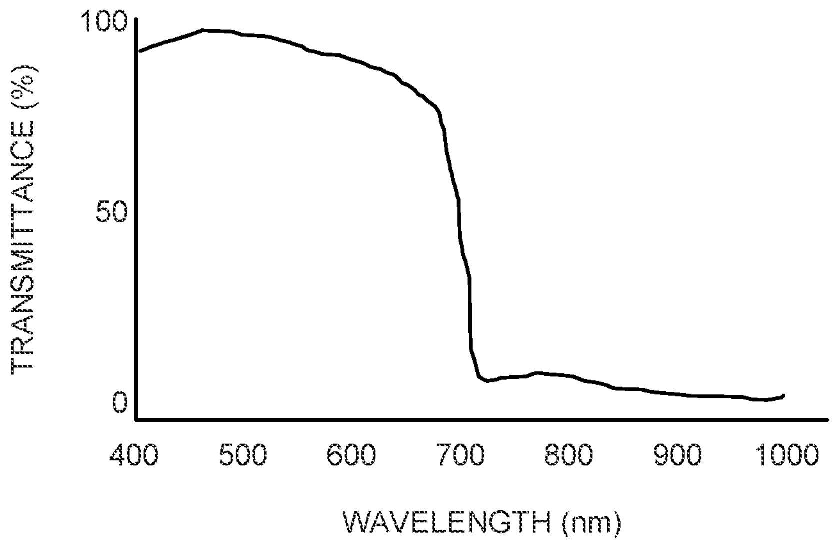
FIG. 21 is a view illustrating another example of a spectral characteristic of the IR cut filter according to an embodiment of the present disclosure.

In addition, as illustrated in FIG. 20, the spectral characteristic of the IR cut filter 41 may have an absorption maximum wavelength in a wavelength region in the vicinity of 950 (nm). In addition, as illustrated in FIG. 21, the spectral characteristic of the IR cut filter 41 may have a transmittance of 20(%) or less in the entire wavelength region of 750 (nm) or more.

Figure 22:
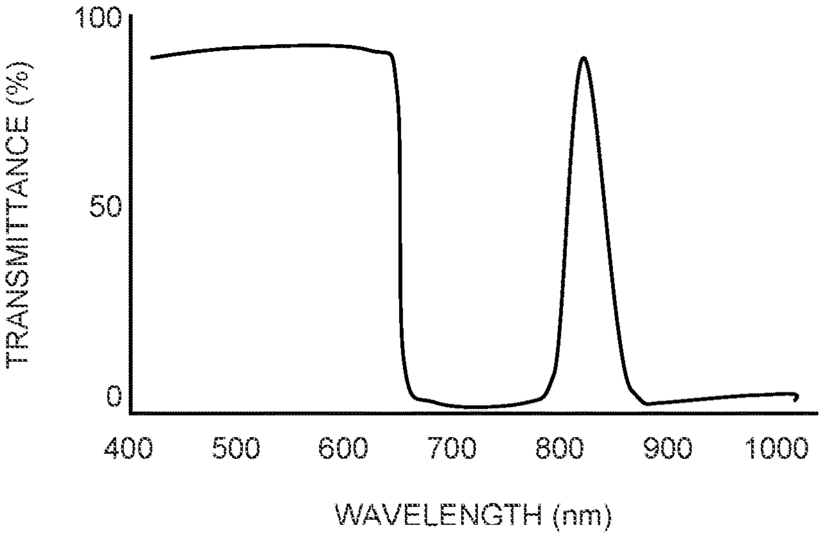
FIG. 22 is a view illustrating another example of a spectral characteristic of the IR cut filter according to an embodiment of the present disclosure.

In addition, as illustrated in FIG. 22, the spectral characteristic of the IR cut filter 41 may transmit infrared light having wavelengths of 800 (nm) to 900 (nm) in addition to visible light.

As described above, by determining the absorption maximum wavelength by the coloring material added to the IR cut filter 41, the IR cut filter 41 can be an optical filter that selectively absorbs infrared light in a predetermined wavelength region in the visible light pixel. In addition, the absorption maximum wavelength of the IR cut filter 41 can be appropriately determined according to the application of the solid-state imaging element 1.

<Eighth Modification>

Figure 23:
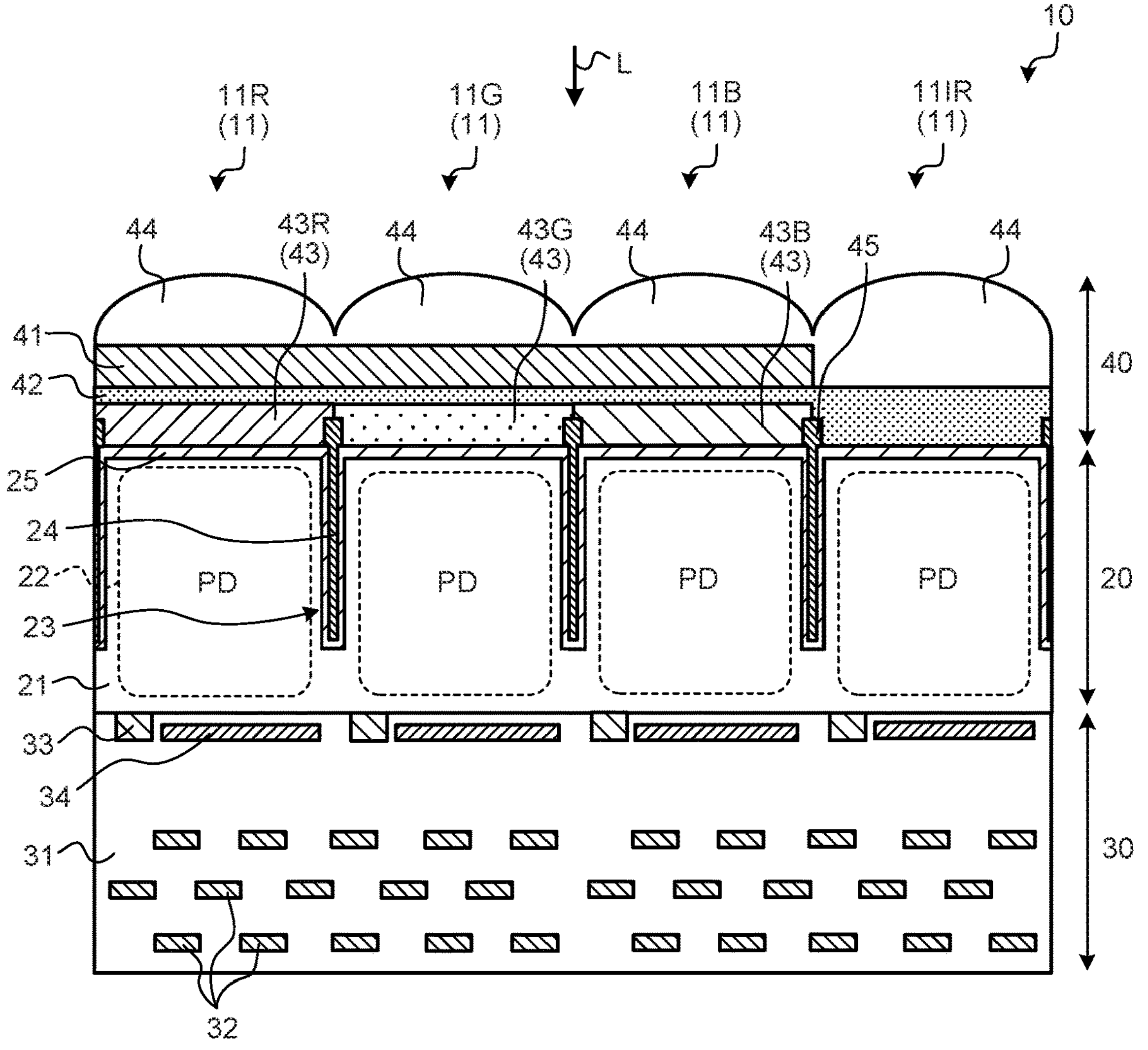
FIG. 23 is a cross-sectional view schematically illustrating a structure of a pixel array unit according to an eighth modification of the embodiment of the present disclosure.

In the embodiment and various modifications described so far, an example in which the IR cut filter 41 is provided on the surface on the light incident side of the semiconductor layer 20 has been described, but the arrangement of the IR cut filter 41 in the present disclosure is not limited to such an example. FIG. 23 is a cross-sectional view schematically illustrating a structure of a pixel array unit 10 according to an eighth modification of the embodiment of the present disclosure.

As illustrated in FIG. 23, in the pixel array unit 10 of the eighth modification, the IR cut filter 41 and the color filter 43 are arranged to be interchanged. That is, in the eighth modification, the color filter 43 is arranged on the surface on the light incident side of the semiconductor layer 20 in the visible light pixel (R pixel 11R, G pixel 11G, and B pixel 11B).

In addition, the planarizing film 42 is provided to planarize the surface on which the IR cut filter 41 and the OCL 44 are formed, and to avoid unevenness occurring in the rotational coating process when the IR cut filter 41 and the OCL 44 are formed.

Then, the IR cut filters 41 are arranged on the surface on the light incident side of the planarizing film 42 in the visible light pixel (R pixel 11R, G pixel 11G, and B pixel 11B).

Also by this, the quality of the signal output from the pixel array unit 10 can be improved by providing the IR cut filter 41 only in the visible light pixel.

<Ninth Modification>

Figure 24:
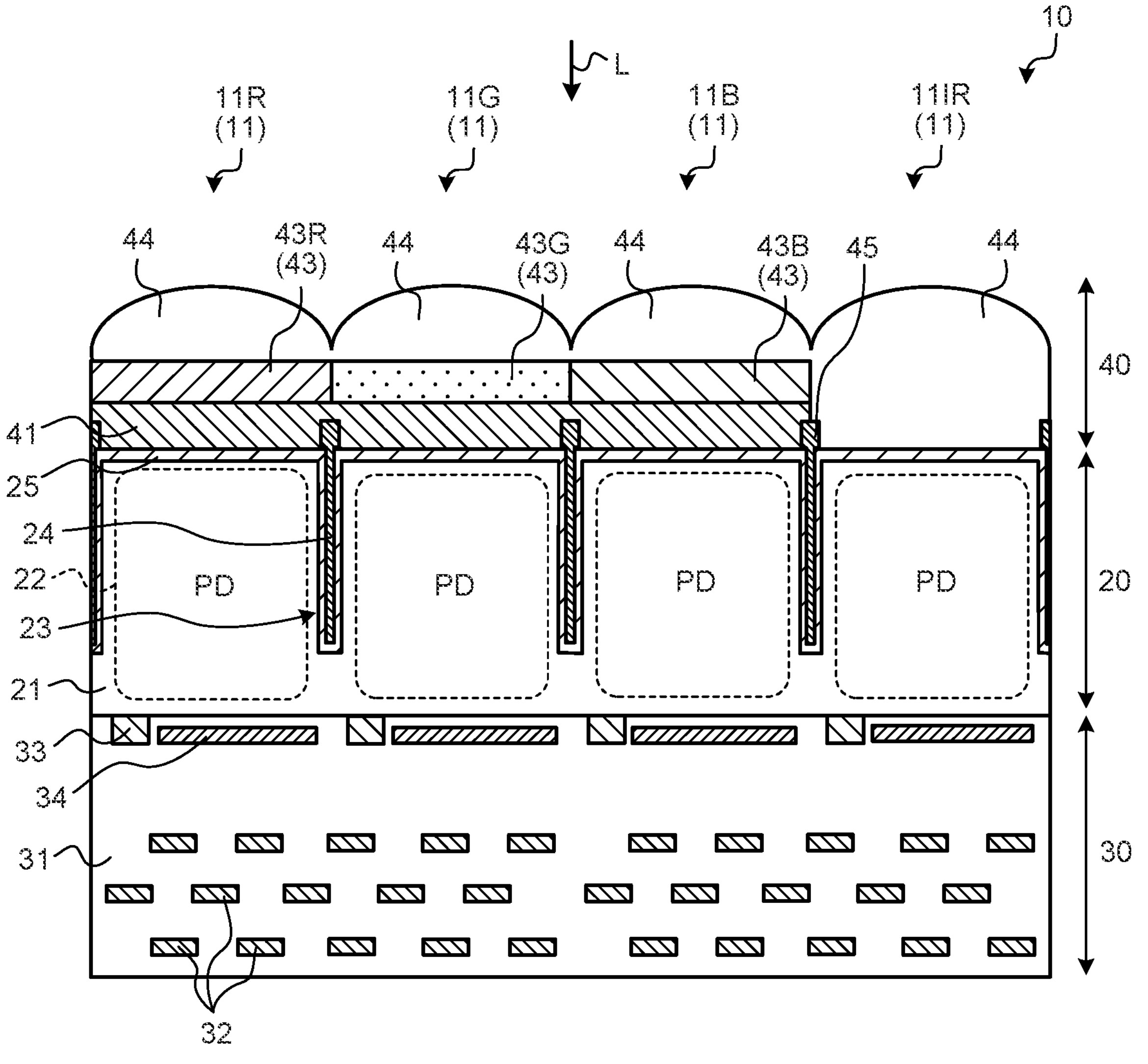
FIG. 24 is a cross-sectional view schematically illustrating a structure of a pixel array unit according to a ninth modification of the embodiment of the present disclosure.

FIG. 24 is a cross-sectional view schematically illustrating a structure of a pixel array unit 10 according to a ninth modification of the embodiment of the present disclosure. As illustrated in FIG. 24, in the pixel array unit 10 of the ninth modification, the planarizing film 42 for planarizing the surface after the IR cut filter 41 is formed is omitted.

That is, in the ninth modification, the color filter 43 is arranged on the surface on the light incident side of the IR cut filter 41 in the visible light pixel (R pixel 11R, G pixel 11G, and B pixel 11B).

Also by this, the quality of the signal output from the pixel array unit 10 can be improved by providing the IR cut filter 41 only in the visible light pixel.

<10th Modification>

Figure 25:
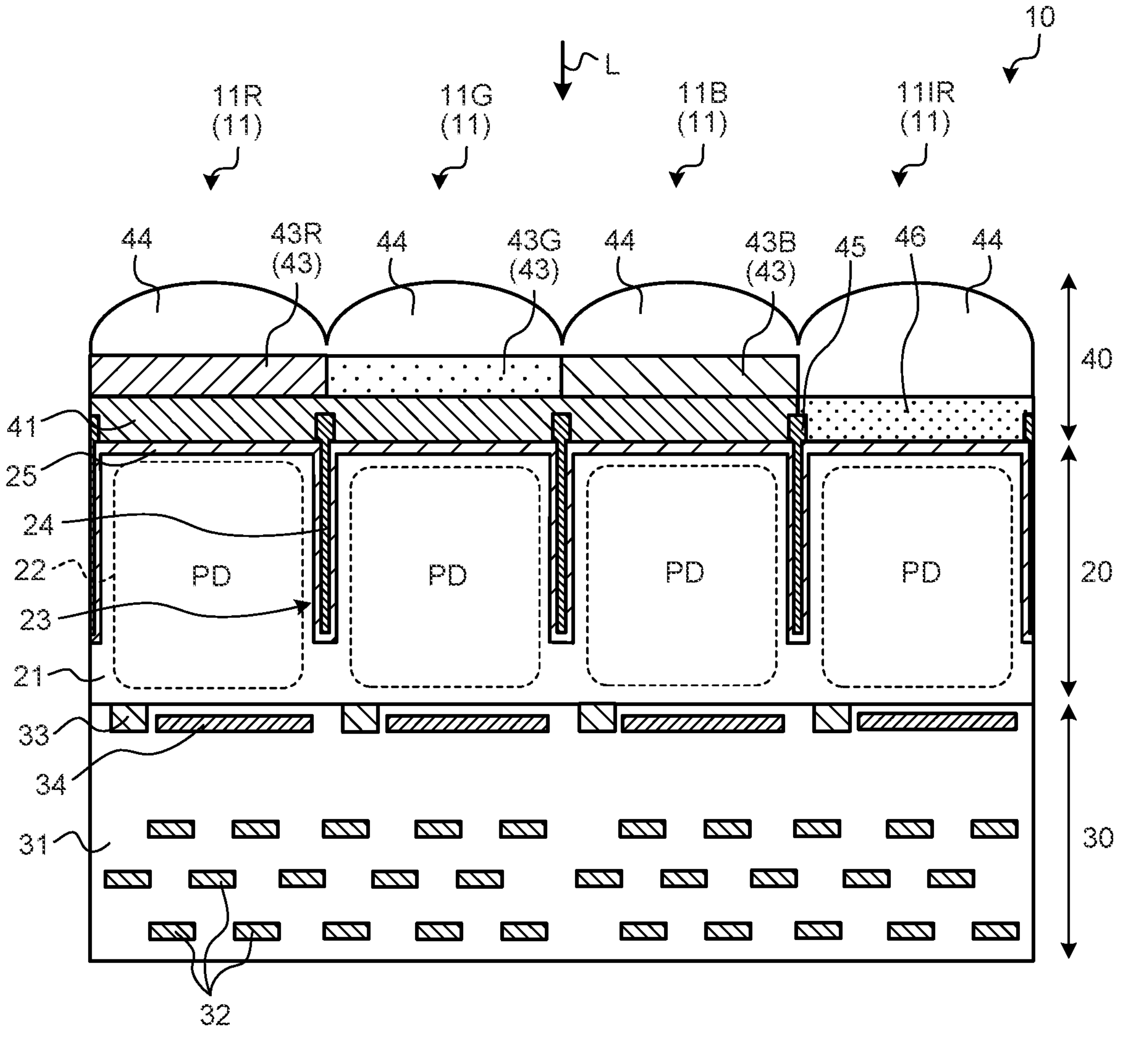
FIG. 25 is a cross-sectional view schematically illustrating a structure of a pixel array unit according to a 10th modification of the embodiment of the present disclosure.

FIG. 25 is a cross-sectional view schematically illustrating a structure of a pixel array unit 10 according to a 10th modification of the embodiment of the present disclosure. As illustrated in FIG. 25, in the pixel array unit 10 of the 10th modification, similarly to the ninth modification described above, the planarizing film 42 for planarizing the surface after the IR cut filter 41 is formed is omitted.

In addition, in the 10th modification, a transparent material 46 is provided between the metal oxide film 25 and the OCL 44 of the semiconductor layer 20 in the IR pixel 11IR. The transparent material 46 has an optical characteristic of transmitting at least infrared light, and is formed in a photolithography process after the IR cut filter 41 is formed.

Also by this, the quality of the signal output from the pixel array unit 10 can be improved by providing the IR cut filter 41 only in the visible light pixel.

<11th Modification>

Figure 26:
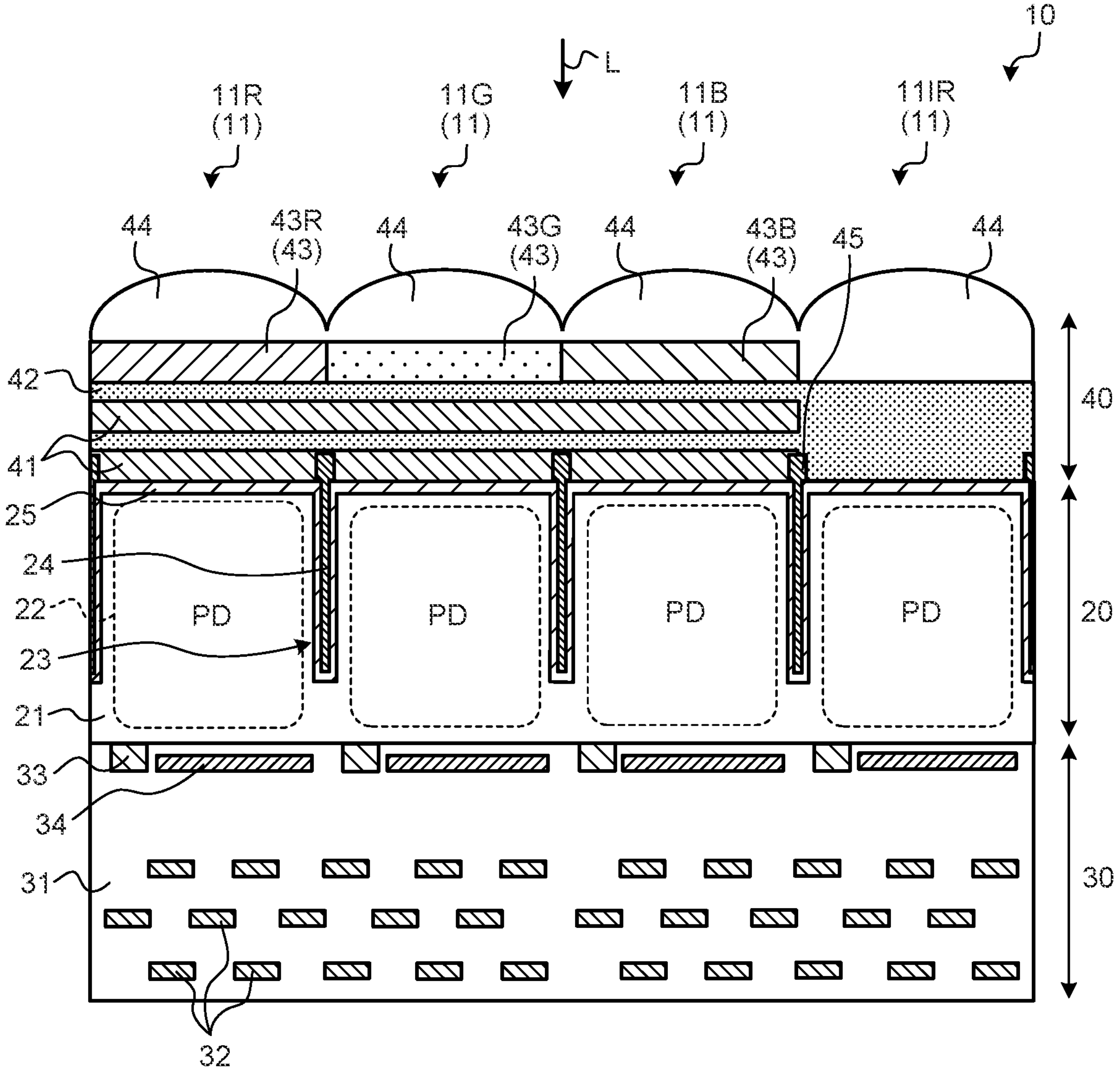
FIG. 26 is a cross-sectional view schematically illustrating a structure of a pixel array unit according to an 11th modification of the embodiment of the present disclosure.

FIG. 26 is a cross-sectional view schematically illustrating a structure of a pixel array unit 10 according to an 11th modification of the embodiment of the present disclosure. As illustrated in FIG. 26, in the pixel array unit 10 of the 11th modification, the IR cut filter 41 has multiple layers (two layers in the drawing).

The multi-layered IR cut filter 41 can be formed, for example, by repeating a process of forming the single-layered IR cut filter 41 and a process of planarizing the surface with the planarizing film 42.

Here, if the single-layered IR cut filter 41 having a large film thickness is to be planarized by the planarizing film 42, unevenness may occur in the planarizing film 42 when the planarizing film 42 is formed.

However, in the 11th modification, since the IR cut filter 41 having a small film thickness is planarized by the planarizing film 42, the occurrence of unevenness in the planarizing film 42 can be suppressed. Furthermore, in the 11th modification, the total film thickness of the IR cut filter 41 can be increased by making the IR cut filter 41 multi-layered.

Therefore, according to the 11th modification, the pixel array unit 10 can be formed with high accuracy, and the quality of the signal output from the pixel array unit 10 can be further improved.

<12th Modification>

Figure 27:
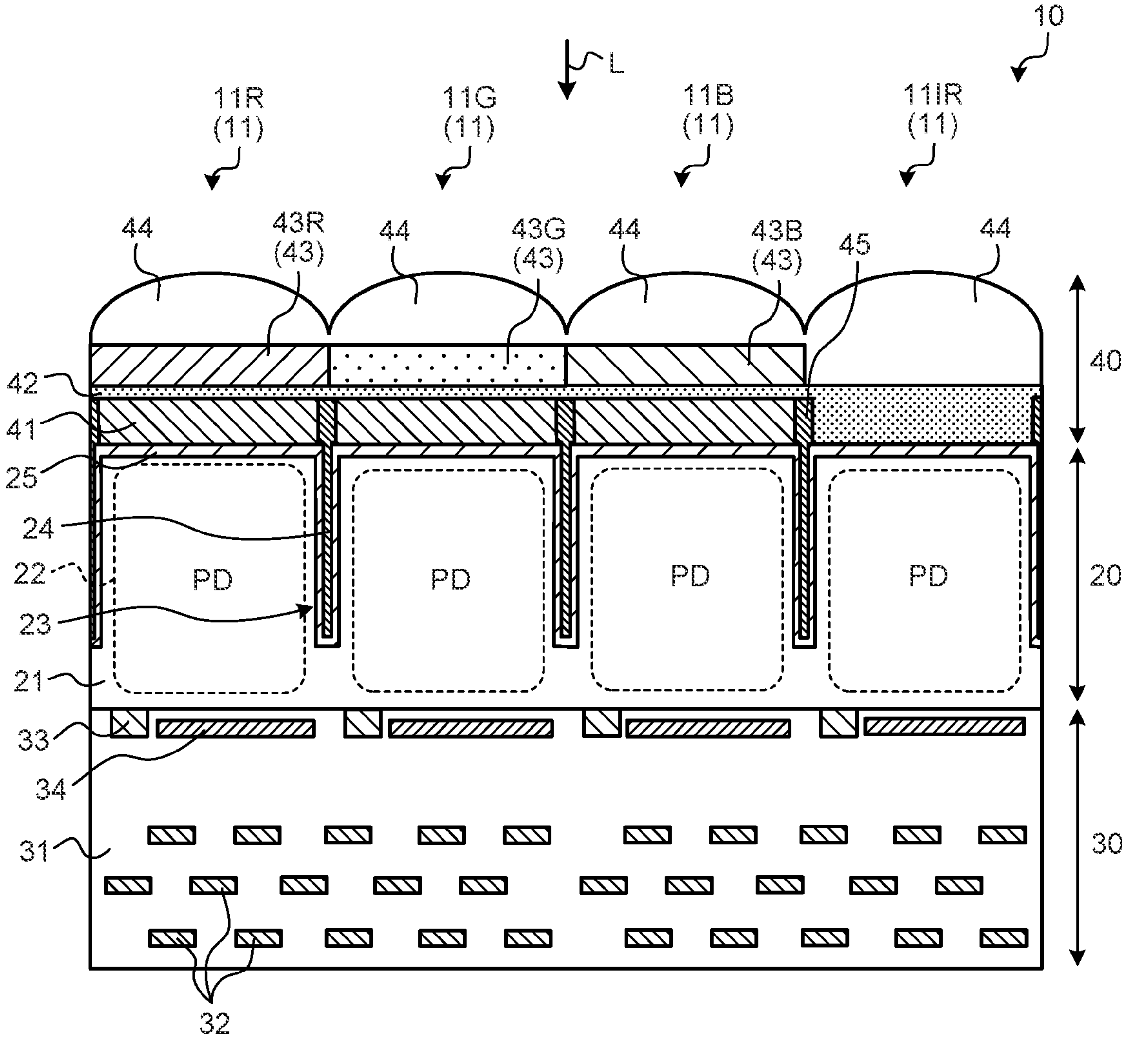
FIG. 27 is a cross-sectional view schematically illustrating a structure of a pixel array unit according to a 12th modification of the embodiment of the present disclosure.

FIG. 27 is a cross-sectional view schematically illustrating a structure of a pixel array unit 10 according to a 12th modification of the embodiment of the present disclosure. As illustrated in FIG. 27, in the pixel array unit 10 of the 12th modification, the light shielding wall 45 is provided to penetrate the IR cut filter 41.

As a result, it is possible to suppress incidence of light transmitted through the IR cut filter 41 and the planarizing film 42 of the adjacent unit pixels 11, and thus, it is possible to further suppress occurrence of color mixing.

<13th Modification>

Figure 28:
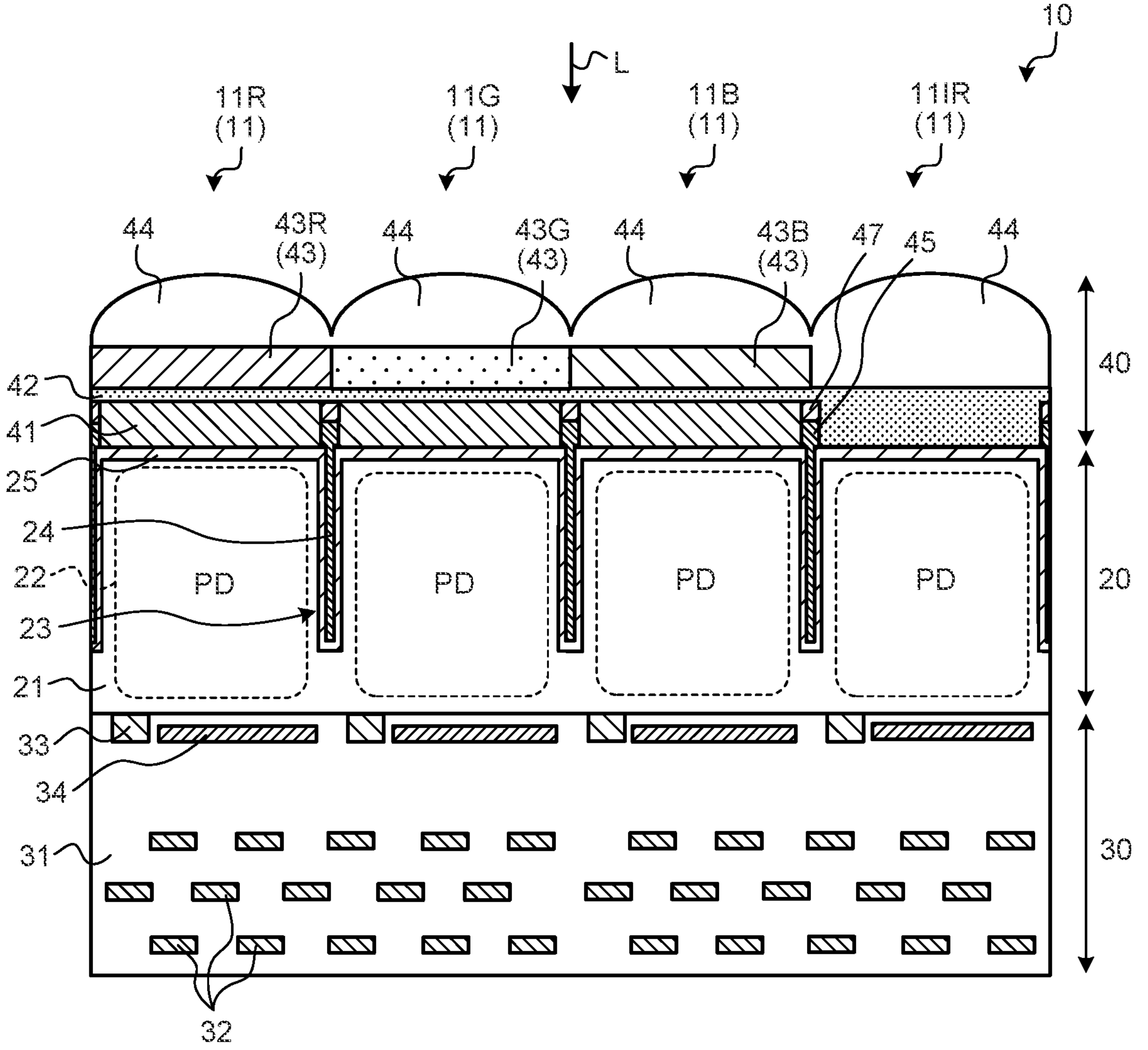
FIG. 28 is a cross-sectional view schematically illustrating a structure of a pixel array unit according to a 13th modification of the embodiment of the present disclosure.

FIG. 28 is a cross-sectional view schematically illustrating a structure of a pixel array unit 10 according to a 13th modification of the embodiment of the present disclosure. As illustrated in FIG. 28, in the pixel array unit 10 of the 13th modification, an optical wall 47 is provided on the light incident side of the light shielding wall 45. Then, in the 13th modification, the integrated light shielding wall 45 and optical wall 47 are provided to penetrate the IR cut filter 41.

The optical wall 47 is made of a material having a low refractive index (for example, n≤1.6), and is made of, for example, silicon oxide or an organic material having a low refractive index.

Also by this, it is possible to suppress incidence of light transmitted through the IR cut filter 41 and the planarizing film 42 of the adjacent unit pixels 11, and thus, it is possible to further suppress occurrence of color mixing.

<Peripheral Structure of Solid-State Imaging Element>

Figure 29:
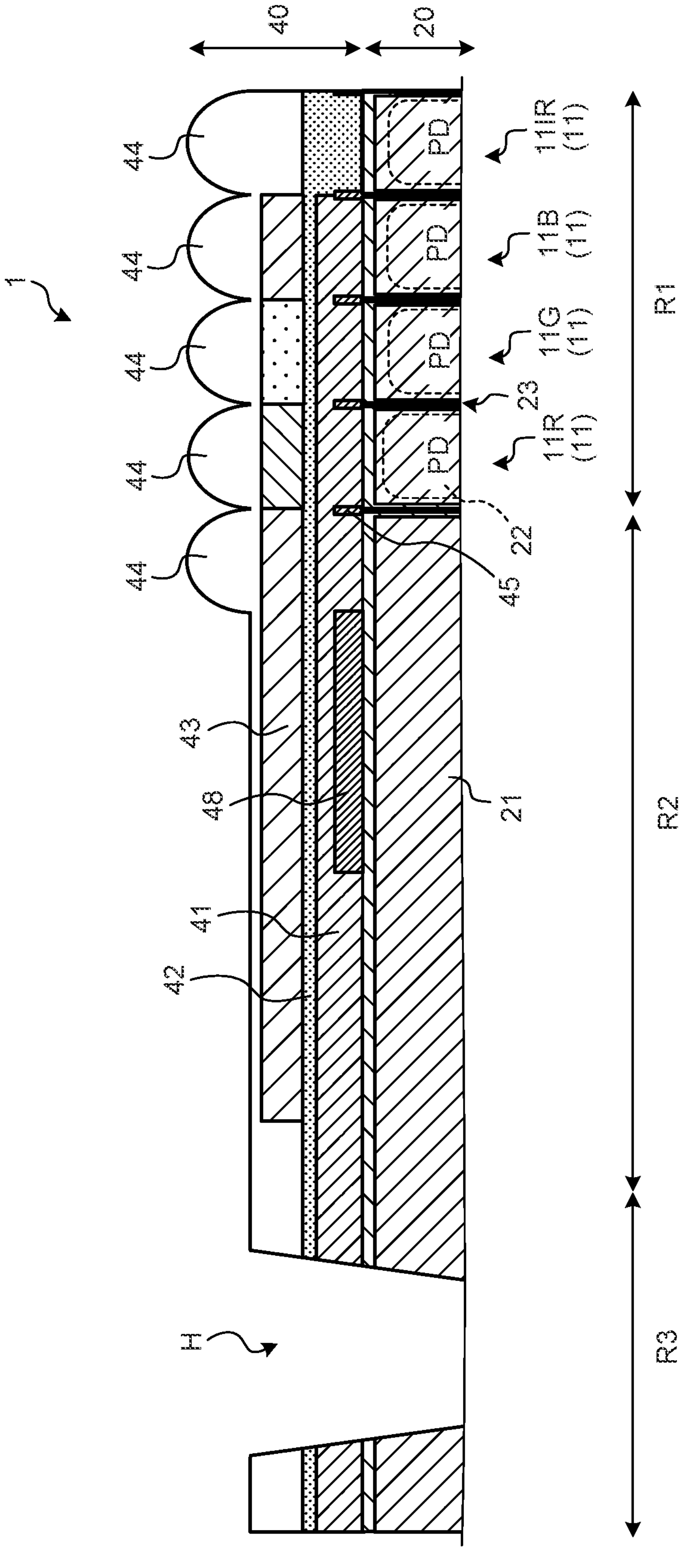
FIG. 29 is a cross-sectional view schematically illustrating a peripheral structure of the solid-state imaging element according to an embodiment of the present disclosure.

FIG. 29 is a cross-sectional view schematically illustrating a peripheral structure of the solid-state imaging element 1 according to an embodiment of the present disclosure, and mainly illustrates a cross-sectional structure of a peripheral portion of the solid-state imaging element 1. As illustrated in FIG. 29, the solid-state imaging element 1 includes a pixel region R1, a peripheral region R2, and a pad region R3.

Figure 30:
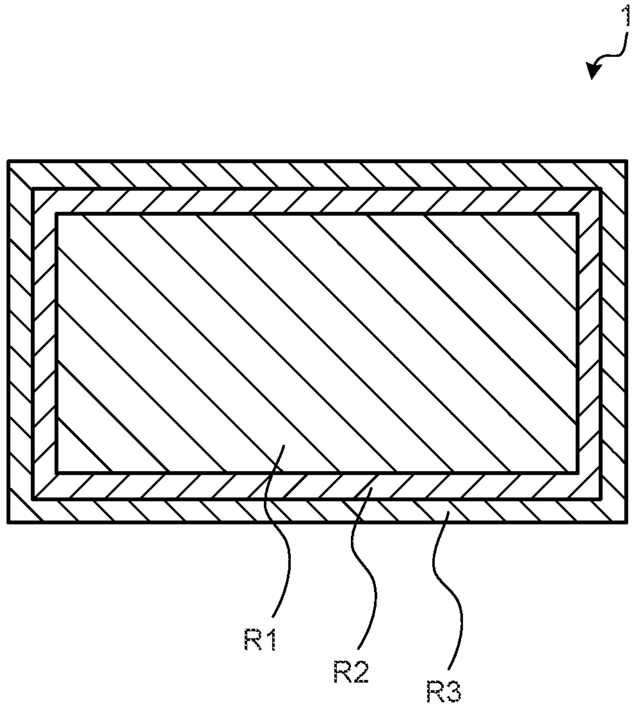
FIG. 30 is a view illustrating a planar configuration of the solid-state imaging element according to an embodiment of the present disclosure.

The pixel region R1 is a region where the unit pixel 11 is provided. In the pixel region R1, a plurality of unit pixels 11 is arranged in a two-dimensional lattice pattern. In addition, as illustrated in FIG. 30, the peripheral region R2 is a region provided to surround four sides of the pixel region R1. FIG. 30 is a view illustrating a planar configuration of the solid-state imaging element 1 according to an embodiment of the present disclosure.

In addition, as illustrated in FIG. 29, a light shielding layer 48 is provided in the peripheral region R2. The light shielding layer 48 is a film that shields light obliquely incident from the peripheral region R2 toward the pixel region R1.

By providing such a light shielding layer 48, it is possible to suppress incidence of light L from the peripheral region R2 to the unit pixel 11 of the pixel region R1, and thus, it is possible to suppress occurrence of color mixing. The light shielding layer 48 is made of, for example, aluminum, tungsten, and the like.

As illustrated in FIG. 30, the pad region R3 is a region provided around peripheral region R2. In addition, as illustrated in FIG. 29, the pad region R3 has a contact hole H. A bonding pad (not illustrated) is provided at the bottom of the contact hole H.

Then, by bonding a bonding wire and the like to the bonding pad via the contact hole H, the pixel array unit 10 and each part of the solid-state imaging element 1 are electrically connected.

Here, in the embodiment, as illustrated in FIG. 29, the IR cut filter 41 is preferably formed not only in the pixel region R1 but also in the peripheral region R2 and the pad region R3.

As a result, it is possible to further suppress incidence of infrared light from the peripheral region R2 and the pad region R3 to the unit pixel 11 of the pixel region R1. Therefore, according to the embodiment, the occurrence of color mixing can be suppressed.

In addition, in the embodiment, by forming the IR cut filter 41 also in the peripheral region R2 and the pad region R3, it is possible to suppress the occurrence of unevenness in the planarizing film 42 in the peripheral region R2 and the pad region R3 when the planarizing film 42 is formed. Therefore, according to the embodiment, the solid-state imaging element 1 can be accurately formed.

In the embodiment and various modifications described so far, the visible light pixel may have a convex portion or a concave portion on the surface on the light incident side in the semiconductor region 21. That is, the visible light pixel according to the embodiment may have a moth-eye structure in which a concave portion having an inverse pyramid shape is provided with respect to a light incident plane of a so-called substrate.

With such a moth-eye structure, the light L incident on the visible light pixel can be confined in the photodiode PD of the incident visible light pixel to increase the optical path length, in a manner that the sensitivity of the visible light pixel can be improved.

In addition, the IR pixel 11IR according to the embodiment may also have a similar moth-eye structure. This also makes it possible to increase the optical path length by confining the light L incident on the IR pixel 11IR in the photodiode PD of the incident IR pixel 11IR, in a manner that the sensitivity of the IR pixel 11IR can be improved.

On the other hand, since at least one of the visible light pixel and the IR pixel 11IR has the moth-eye structure, the direction of the light L becomes oblique, in a manner that the occurrence of color mixing may increase.

However, in the pixel array unit 10 according to the embodiment, since the occurrence of color mixing can be suppressed as described above, even if at least one of the visible light pixel and the IR pixel 11IR has the moth-eye structure, it is possible to acquire an image having no problem in practical use. That is, according to the embodiment, both improvement of sensitivity and suppression of color mixing can be achieved.

<Effects>

The solid-state imaging element 1 according to the embodiment includes a plurality of first light receiving pixels (R pixel 11R, G pixel 11G, and B pixel 11B) that receives visible light, a plurality of second light receiving pixels (IR pixels 11IR) that receives infrared light, a separation region 23, and a light shielding wall 24. In the pixel array unit 10 in which the plurality of first light receiving pixels and the plurality of second light receiving pixels are arranged in a matrix, the separation region 23 is arranged in a lattice pattern between the light receiving pixels adjacent to each other, and has a plurality of intersection portions 23*a*. The light shielding wall 24 is provided in the separation region 23. In addition, the light shielding wall 24 includes a first light shielding wall 24*a* provided along a first direction in plan view, and a second light shielding wall 24*b* provided along a second direction intersecting the first direction in plan view. In addition, the first light shielding wall 24*a* and the second light shielding wall 24*b* are spaced apart at the intersection portion 23*a* of at least a part of the separation region 23.

As a result, the occurrence of color mixing caused by the IR pixel 11IR can be suppressed.

In addition, in the solid-state imaging element 1 according to the embodiment, the first light shielding wall 24*a* and the second light shielding wall 24*b* are spaced apart at all the intersection portions 23*a* of the separation region 23.

As a result, the occurrence of color mixing caused by the IR pixel 11IR can further be suppressed.

In addition, in the solid-state imaging element 1 according to the embodiment, the first light shielding wall 24*a* and the second light shielding wall 24*b* are arranged in a windmill shape in plan view.

As a result, the occurrence of color mixing caused by the IR pixel 11IR can further be suppressed.

In addition, in the solid-state imaging element 1 according to the embodiment, the first light shielding wall 24*a* is connected from one end to the other end of the pixel array unit 10, and the second light shielding wall 24*b* is spaced apart from the first light shielding wall 24*a* at the intersection portion 23*a*.

As a result, the occurrence of color mixing caused by the IR pixel 11IR can further be suppressed.

In addition, in the solid-state imaging element 1 according to the embodiment, the first light shielding wall 24*a* and the second light shielding wall 24*b* are spaced apart at a part of the intersection portions 23*a* of the separation region 23.

As a result, the occurrence of color mixing caused by the IR pixel 11IR can be suppressed.

In addition, in the solid-state imaging element 1 according to the embodiment, the light shielding wall 24 is provided to surround the second light receiving pixel (IR pixel 11IR) without a gap in plan view.

As a result, the occurrence of color mixing caused by the IR pixel 11IR can be suppressed.

In addition, in the solid-state imaging element 1 according to the embodiment, the end portion of the light shielding wall 24 in plan view is thinner than the intermediate portion of the light shielding wall 24 in plan view.

As a result, it is possible to achieve both improvement in reliability of the pixel array unit 10 and improvement in sensitivity of the unit pixel 11.

<Electronic Device>

Note that the present disclosure is not limited to application to a solid-state imaging element. That is, the present disclosure is applicable to all electronic devices having a solid-state imaging element, such as a camera module, an imaging device, a mobile terminal device having an imaging function, or a copying machine using a solid-state imaging element in an image reading unit, in addition to the solid-state imaging element.

Examples of such an imaging device include a digital still camera and a video camera. In addition, examples of the portable terminal device having such an imaging function include a smartphone and a tablet terminal.

Figure 31:
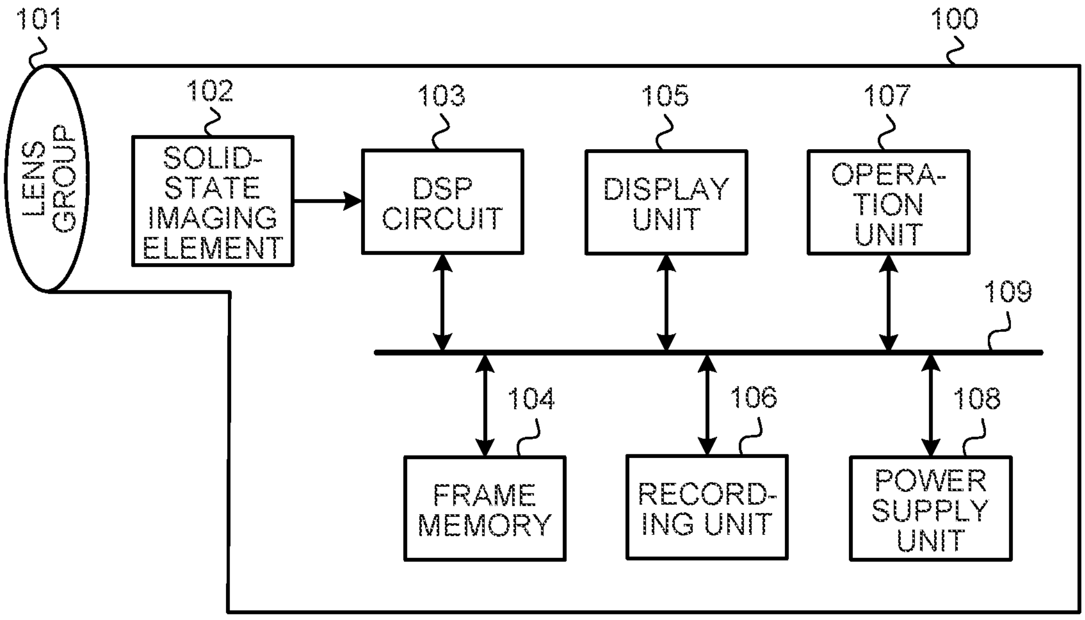
FIG. 31 is a block view illustrating a configuration example of an imaging device as an electronic device to which the technology according to the present disclosure is applied.

FIG. 31 is a block view illustrating a configuration example of an imaging device as an electronic device 100 to which the technology according to the present disclosure is applied. The electronic device 100 in FIG. 31 is, for example, an electronic device such as an imaging device such as a digital still camera or a video camera, or a mobile terminal device such as a smartphone or a tablet terminal.

In FIG. 31, the electronic device 100 includes a lens group 101, a solid-state imaging element 102, a DSP circuit 103, a frame memory 104, a display unit 105, a recording unit 106, an operation unit 107, and a power supply unit 108.

In addition, in the electronic device 100, the DSP circuit 103, the frame memory 104, the display unit 105, the recording unit 106, the operation unit 107, and the power supply unit 108 are mutually connected via a bus line 109.

The lens group 101 captures incident light (image light) from a subject and forms an image on an imaging surface of the solid-state imaging element 102. The solid-state imaging element 102 corresponds to the solid-state imaging element 1 according to the above-described embodiment, and converts the amount of incident light imaged on the imaging surface by the lens group 101 into an electrical signal in units of pixels and outputs the electrical signal as a pixel signal.

The DSP circuit 103 is a camera signal processing circuit that processes a signal supplied from the solid-state imaging element 102. The frame memory 104 temporarily holds the image data processed by the DSP circuit 103 in units of frames.

The display unit 105 includes, for example, a panel type display device such as a liquid crystal panel or an organic electro luminescence (EL) panel, and displays a moving image or a still image captured by the solid-state imaging element 102. The recording unit 106 records image data of a moving image or a still image captured by the solid-state imaging element 102 on a recording medium such as a semiconductor memory or a hard disk.

The operation unit 107 issues operation commands for various functions of the electronic device 100 in accordance with an operation by a user. The power supply unit 108 appropriately supplies various power sources serving as operation power sources of the DSP circuit 103, the frame memory 104, the display unit 105, the recording unit 106, and the operation unit 107 to these supply targets.

In the electronic device 100 configured as described above, by applying the solid-state imaging element 1 of each of the above-described embodiments as the solid-state imaging element 102, it is possible to suppress the occurrence of color mixing caused by the IR pixel 11IR.

Although the embodiments of the present disclosure have been described above, the technical scope of the present disclosure is not limited to the above-described embodiments as it is, and various modifications can be made without departing from the gist of the present disclosure. In addition, components of different embodiments and modifications may be appropriately combined.

In addition, the effects described in the present specification are merely examples and are not limited, and other effects may be provided.

Note that the present technology can also have the configuration below.

(1)

A solid-state imaging element comprising:

a plurality of first light receiving pixels that receives visible light;

a plurality of second light receiving pixels that receives infrared light;

a separation region arranged in a lattice pattern between adjacent light receiving pixels in a pixel array unit in which the plurality of first light receiving pixels and the plurality of second light receiving pixels are arranged in a matrix pattern, the isolation region having a plurality of intersection portions; and a light shielding wall provided in the separation region, wherein the light shielding wall includes a first light shielding wall provided along a first direction in plan view, and a second light shielding wall provided along a second direction intersecting the first direction in plan view, and the first light shielding wall and the second light shielding wall are spaced apart at the intersection portion of at least a part of the separation region.

(2)

The solid-state imaging element according to the above (1), wherein the first light shielding wall and the second light shielding wall are spaced apart at all the intersection portions of the separation region.

(3)

The solid-state imaging element according to the above (2), wherein the first light shielding wall and the second light shielding wall are arranged in a windmill shape in plan view.

(4)

The solid-state imaging element according to the above (2), wherein the first light shielding wall is connected from one end to the other end of the pixel array unit, and the second light shielding wall is spaced apart from the first light shielding wall at the intersection portion.

(5)

The solid-state imaging element according to the above (1), wherein the first light shielding wall and the second light shielding wall are spaced apart at the intersection portion of a part of the separation region.

(6)

The solid-state imaging element according to the above (5), wherein the light shielding wall is provided to surround the second light receiving pixel without a gap in plan view.

(7)

The solid-state imaging element according to any one of the above (1) to (6), wherein an end portion of the light shielding wall in plan view is thinner than an intermediate portion of the light shielding wall in plan view.

(8)

An electronic device comprising:

a solid-state imaging element;

an optical system that captures incident light from a subject and forms an image on an imaging surface of the solid-state imaging element; and a signal processing circuit that perform processing on an output signal from the solid-state imaging element, wherein the solid-state imaging element includes a plurality of first light receiving pixels that receives visible light, a plurality of second light receiving pixels that receives infrared light, a separation region arranged in a lattice pattern between adjacent light receiving pixels in a pixel array unit in which the plurality of first light receiving pixels and the plurality of second light receiving pixels are arranged in a matrix pattern, the isolation region having a plurality of intersection portions, and a light shielding wall provided in the separation region, in which the light shielding wall includes a first light shielding wall provided along a first direction in plan view, and a second light shielding wall provided along a second direction intersecting the first direction in plan view, and the first light shielding wall and the second light shielding wall are spaced apart at the intersection portion of at least a part of the separation region.

(9)

The electronic device according to the above (8), in which the first light shielding wall and the second light shielding wall are spaced apart at all the intersection portions of the separation region.

(10)

The electronic device according to the above (9), in which the first light shielding wall and the second light shielding wall are arranged in a windmill shape in plan view.

(11)

The electronic device according to the above (9), in which the first light shielding wall is connected from one end to the other end of the pixel array unit, and the second light shielding wall is spaced apart from the first light shielding wall at the intersection portion.

(12)

The electronic device according to the above (8), in which the first light shielding wall and the second light shielding wall are spaced apart at the intersection portion of a part of the separation region.

(13) The electronic device according to the above (12), in which the light shielding wall is provided to surround the second light receiving pixel without a gap in plan view.

(14)

The electronic device according to any one of the above (8) to (13), in which an end portion of the light shielding wall in plan view is thinner than an intermediate portion of the light shielding wall in plan view.

REFERENCE SIGNS LIST

1 SOLID-STATE IMAGING ELEMENT
10 PIXEL ARRAY UNIT
11 UNIT PIXEL
11R R PIXEL (EXAMPLE OF FIRST LIGHT RECEIVING PIXEL)
11G G PIXEL (EXAMPLE OF FIRST LIGHT RECEIVING PIXEL)
11B B PIXEL (EXAMPLE OF FIRST LIGHT RECEIVING PIXEL)
11IR IR PIXEL (EXAMPLE OF SECOND LIGHT RECEIVING PIXEL)
20 SEMICONDUCTOR LAYER
23 SEPARATION REGION
23*a* INTERSECTION PORTION
24 LIGHT SHIELDING WALL
24*a* FIRST LIGHT SHIELDING WALL
24*b* SECOND LIGHT SHIELDING WALL
100 ELECTRONIC DEVICE
PD PHOTODIODE (EXAMPLE OF PHOTOELECTRIC CONVERSION UNIT)

What is claimed is:

1. A solid-state imaging element, comprising:

a plurality of first light receiving pixels that receives visible light;

a plurality of second light receiving pixels that receives infrared light;

a separation region arranged in a lattice pattern between adjacent light receiving pixels in a pixel array unit in which the plurality of first light receiving pixels and the plurality of second light receiving pixels are arranged in a matrix pattern, the separation region having a plurality of intersection portions; and a light shielding wall provided in the separation region, wherein the light shielding wall includes a first light shielding wall provided along a first direction in a plan view, and a second light shielding wall provided along a second direction intersecting the first direction in the plan view, wherein a first one of the first light shielding walls extends continuously across a first side of a first pixel included in one of the plurality of first light receiving pixels or the plurality of second light receiving pixels and across a first side of a second pixel included in the plurality of first light receiving pixels or the plurality of second light receiving pixels, and wherein a first one of the second light shielding walls extending between the first pixel and the second pixel is spaced apart from the first one of the first light shielding walls at a first one of the intersection portions of the separation region.

2. The solid-state imaging element according to claim 1, wherein the first light shielding wall and the second light shielding wall are spaced apart at every other corner of at least some of the pixels included in the plurality of first light receiving pixels.

3. The solid-state imaging element according to claim 2, wherein the first light shielding wall and the second light shielding wall are arranged in a windmill shape in the plan view.

4. The solid-state imaging element according to claim 2, wherein the first light shielding wall is connected from one end to another end of the pixel array unit, and the second light shielding wall is spaced apart from the first light shielding wall at the intersection portion.

5. The solid-state imaging element according to claim 1, wherein the first light shielding wall and the second light shielding wall are spaced apart at some of the intersection portions included in the plurality of intersection portions.

6. The solid-state imaging element according to claim 5, wherein the light shielding wall is surrounds each pixel included in the plurality of second light receiving pixels without a gap in the plan view.

7. The solid-state imaging element according to claim 1, wherein an end portion of the light shielding wall in a cross-sectional view is thinner than an intermediate portion of the light shielding wall in the cross-sectional view.

8. An electronic device, comprising:

a solid-state imaging element;

an optical system that captures incident light from a subject and forms an image on an imaging surface of the solid-state imaging element; and a signal processing circuit that performs processing on an output signal from the solid-state imaging element, wherein the solid-state imaging element includes:

a plurality of first light receiving pixels that receives visible light, a plurality of second light receiving pixels that receives infrared light, a separation region arranged in a lattice pattern between adjacent light receiving pixels in a pixel array unit in which the plurality of first light receiving pixels and the plurality of second light receiving pixels are arranged in a matrix pattern, the separation region having a plurality of intersection portions, and a light shielding wall provided in the separation region, in which:

the light shielding wall includes a first light shielding wall provided along a first direction a in plan view, and a second light shielding wall provided along a second direction intersecting the first direction in the plan view, a first one of the first light shielding walls extends continuously across a first side of a first pixel included in one of the plurality of first light receiving pixels or the plurality of second light receiving pixels and across a first side of a second pixel included in the plurality of first light receiving pixels or the plurality of second light receiving pixels, and a first one the second light shielding walls extending between the first pixel and the second pixel is spaced apart from the first one of the first light shielding walls at a first one of the intersection portions.

* * * * *